(12) United States Patent
Chen et al.

(10) Patent No.: US 10,020,286 B2
(45) Date of Patent: Jul. 10, 2018

(54) PACKAGE ON PACKAGE DEVICES AND METHODS OF PACKAGING SEMICONDUCTOR DIES

(71) Applicant: Taiwan Semiconductor Manufacturing Company, Ltd., Hsin-Chu (TW)

(72) Inventors: Yung Ching Chen, Dali (TW); Chien-Hsun Lee, Hsin-Chu (TW); Chen-Hua Yu, Hsin-Chu (TW); Jiun Yi Wu, Zhongli (TW); Ming-Da Cheng, Jhubei (TW); Mirng-Ji Lii, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/885,807

(22) Filed: Oct. 16, 2015

(65) Prior Publication Data

US 2016/0035709 A1 Feb. 4, 2016

Related U.S. Application Data

(62) Division of application No. 13/552,375, filed on Jul. 18, 2012, now Pat. No. 9,171,790.

(51) Int. Cl.
*H01L 23/498* (2006.01)
*H01L 25/065* (2006.01)
(Continued)

(52) U.S. Cl.
CPC ...... *H01L 25/0657* (2013.01); *H01L 21/4853* (2013.01); *H01L 21/68778* (2013.01);
(Continued)

(58) Field of Classification Search
CPC ....... H01L 2224/13017; H01L 25/0657; H01L 24/10
See application file for complete search history.

(56) References Cited

U.S. PATENT DOCUMENTS

| 5,640,051 A | * | 6/1997 | Tomura | ............... H01L 21/4853 |
| | | | | 257/693 |
| 5,860,585 A | * | 1/1999 | Rutledge | ................. H01L 24/11 |
| | | | | 228/254 |

(Continued)

FOREIGN PATENT DOCUMENTS

| KR | 20060069502 | 6/2006 |
| KR | 20100075204 | 7/2010 |

OTHER PUBLICATIONS

McCormick, H., et al., "Assembly and Reliability Assessment of Fine Pitch TMV Package on Package (PoP) Components," Proceedings of the SMTA International Conference, San Diego, CA Oct. 4-8, 2009, 8 pages.

(Continued)

*Primary Examiner* — Stephen Bradley
(74) *Attorney, Agent, or Firm* — Slater Matsil, LLP

(57) ABSTRACT

Package on package (PoP) devices and methods of packaging semiconductor dies are disclosed. A PoP device includes a first packaged die and a second packaged die coupled to the first packaged die. Metal stud bumps are disposed between the first packaged die and the second packaged die. The metal stud bumps include a stick region, a first ball region coupled to a first end of the stick region, and a second ball region coupled to a second end of the stick region. The metal stud bumps include a portion that is partially embedded in a solder joint.

20 Claims, 15 Drawing Sheets

(51) Int. Cl.
*H01L 21/48* (2006.01)
*H01L 25/10* (2006.01)
*H01L 25/00* (2006.01)
*H01L 21/687* (2006.01)
*H01L 23/31* (2006.01)
*H01L 23/00* (2006.01)

(52) U.S. Cl.
CPC .... *H01L 23/3142* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 24/17* (2013.01); *H01L 25/105* (2013.01); *H01L 25/50* (2013.01); *H01L 24/73* (2013.01); *H01L 2224/131* (2013.01); *H01L 2224/13124* (2013.01); *H01L 2224/13144* (2013.01); *H01L 2224/13147* (2013.01); *H01L 2224/13164* (2013.01); *H01L 2224/13169* (2013.01); *H01L 2224/16058* (2013.01); *H01L 2224/16148* (2013.01); *H01L 2224/16238* (2013.01); *H01L 2224/26175* (2013.01); *H01L 2224/32145* (2013.01); *H01L 2224/32225* (2013.01); *H01L 2224/48227* (2013.01); *H01L 2224/73204* (2013.01); *H01L 2224/73253* (2013.01); *H01L 2224/73265* (2013.01); *H01L 2224/81191* (2013.01); *H01L 2224/92125* (2013.01); *H01L 2225/0651* (2013.01); *H01L 2225/0652* (2013.01); *H01L 2225/06513* (2013.01); *H01L 2225/06548* (2013.01); *H01L 2225/06565* (2013.01); *H01L 2225/06572* (2013.01); *H01L 2225/1023* (2013.01); *H01L 2225/1052* (2013.01); *H01L 2225/1058* (2013.01); *H01L 2924/15311* (2013.01); *H01L 2924/15331* (2013.01); *H01L 2924/181* (2013.01); *H01L 2924/19107* (2013.01); *H01L 2924/2064* (2013.01); *H01L 2924/20641* (2013.01); *H01L 2924/20642* (2013.01); *H01L 2924/20643* (2013.01); *H01L 2924/20644* (2013.01); *H01L 2924/20645* (2013.01)

(56) References Cited

U.S. PATENT DOCUMENTS

| | | | |
|---|---|---|---|
| 5,889,326 A * | 3/1999 | Tanaka | H01L 24/11 257/737 |
| 5,908,317 A * | 6/1999 | Heo | H01L 21/4853 228/180.22 |
| 6,062,459 A | 5/2000 | Sabyeying | |
| 6,215,670 B1 * | 4/2001 | Khandros | B23K 1/0016 257/696 |
| 6,872,592 B2 | 3/2005 | D'Amato et al. | |
| 7,246,735 B2 | 7/2007 | Liu et al. | |
| 7,372,151 B1 | 5/2008 | Fan et al. | |
| 7,405,478 B2 | 7/2008 | Ishikawa et al. | |
| 7,476,564 B2 | 1/2009 | Chen et al. | |
| 7,614,538 B2 | 11/2009 | Gillotti et al. | |
| 8,072,070 B2 | 12/2011 | Lee et al. | |
| 8,299,595 B2 * | 10/2012 | Yoon | H01L 23/3128 257/686 |
| 8,304,880 B2 * | 11/2012 | Chow | H01L 21/563 257/685 |
| 8,525,318 B1 | 9/2013 | Kim et al. | |
| 8,823,180 B2 | 9/2014 | Wang et al. | |
| 2002/0011674 A1 | 1/2002 | Efland et al. | |
| 2002/0117330 A1 * | 8/2002 | Eldridge | B23K 20/004 174/260 |
| 2003/0173684 A1 | 9/2003 | Joshi et al. | |
| 2004/0145051 A1 | 7/2004 | Klein et al. | |
| 2005/0067714 A1 | 3/2005 | Rumer et al. | |
| 2005/0087883 A1 | 4/2005 | Hwee et al. | |
| 2005/0199677 A1 | 9/2005 | Sadler et al. | |
| 2006/0055032 A1 | 3/2006 | Chang et al. | |
| 2006/0286828 A1 | 12/2006 | Khandros | |
| 2007/0222053 A1 | 9/2007 | Wei et al. | |
| 2008/0017968 A1 * | 1/2008 | Choi | H01L 21/565 257/686 |
| 2008/0073769 A1 | 3/2008 | Wu et al. | |
| 2008/0083993 A1 * | 4/2008 | Zeng | H01L 24/11 257/777 |
| 2008/0258289 A1 | 10/2008 | Pendse et al. | |
| 2010/0133675 A1 | 6/2010 | Yu et al. | |
| 2010/0155920 A1 | 6/2010 | Lee | |
| 2010/0171205 A1 | 7/2010 | Chen et al. | |
| 2010/0224974 A1 | 9/2010 | Shim et al. | |
| 2010/0314739 A1 | 12/2010 | Kaufmann et al. | |
| 2011/0298119 A1 * | 12/2011 | Cho | H01L 23/3128 257/686 |
| 2012/0306075 A1 * | 12/2012 | Kim | H01L 25/105 257/738 |
| 2013/0105979 A1 | 5/2013 | Yu et al. | |
| 2013/0168856 A1 | 7/2013 | Wang et al. | |
| 2014/0021605 A1 | 1/2014 | Yu et al. | |

OTHER PUBLICATIONS

Smith, L., "Package-in-package: thinner, faster, denser," Electro IQ Technology Insights for Electronics Manufacturing, Solid State Technology, vol. 54, Issue 7, Jul. 12, 2011, pp. 1-6.

* cited by examiner

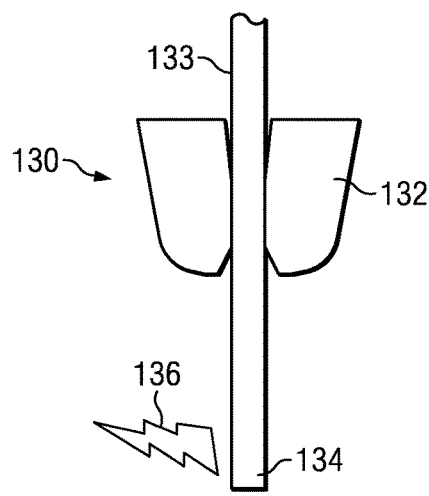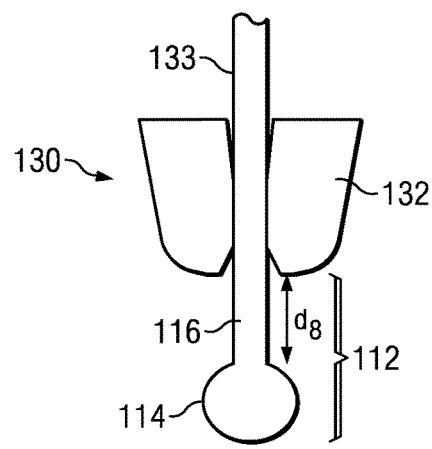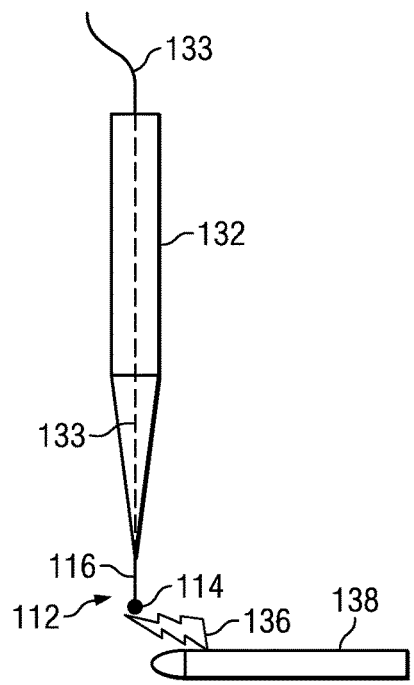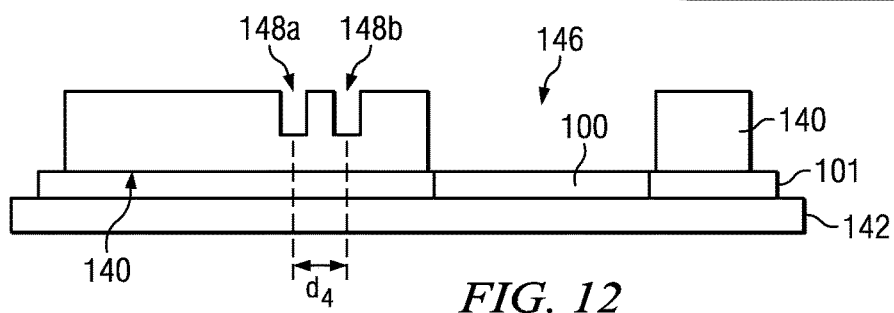
FIG. 10
FIG. 11
FIG. 12

PACKAGE ON PACKAGE DEVICES AND METHODS OF PACKAGING SEMICONDUCTOR DIES

CROSS-REFERENCE TO RELATED APPLICATIONS

This application is a divisional application of patent application Ser. No. 13/552,375, entitled "Package on Package Devices and Methods of Packaging Semiconductor Dies," filed on Jul. 18, 2012, which application is incorporated herein by reference.

This application relates to the following co-pending and commonly assigned U.S. patent applications: Ser. No. 13/483,734, filed on May 30, 2012, entitled, "Package on Package Devices and Methods of Packaging Semiconductor Dies," and Ser. No. 13/493,862, filed on Jun. 11, 2012, entitled, "Package on Package Devices and Methods of Packaging Semiconductor Dies," which applications are hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Package on package (PoP) technology is becoming increasingly popular for its ability to allow for denser integration of integrated circuits into a small overall package. PoP technology is employed in many advanced handheld devices, such as smart phones and electronic tablets. While PoP technology has allowed for lower package profiles, the total thickness reduction is currently limited by the solder ball joint height between the top package and bottom package.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 10 and 11 illustrate cross-sectional views of a method of forming metal stud bumps in accordance with an embodiment;

FIGS. 12 through 17 are cross-sectional views illustrating a method of forming metal stud bumps on the first substrates using the window clamp in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 20:
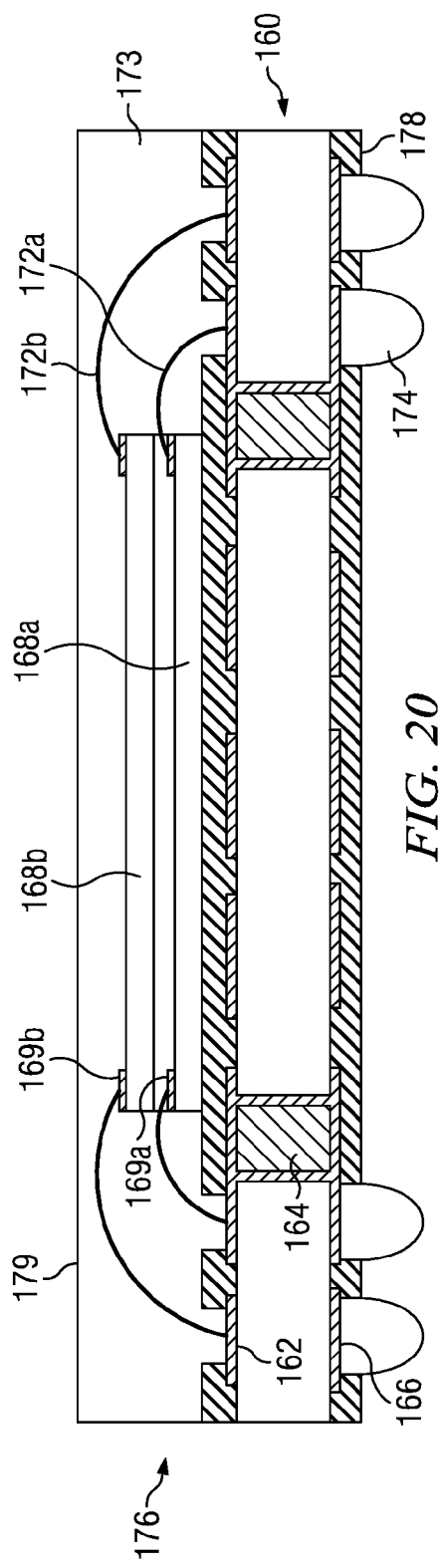
FIG. 20 is a cross-sectional view of a packaged second die including a plurality of solder balls formed on a bottom surface thereof in accordance with embodiment.
Figure 21:
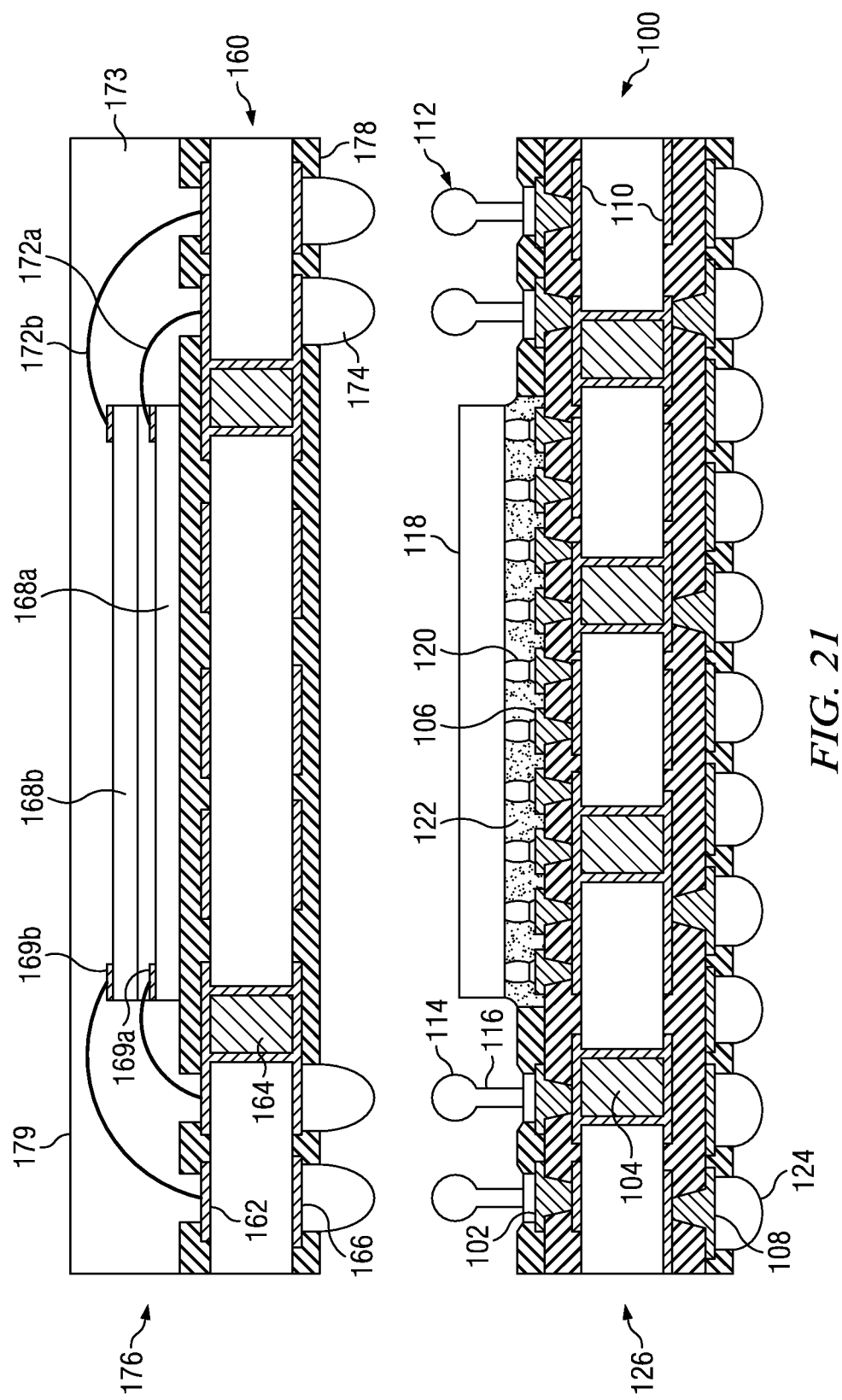
FIG. 21 illustrates a cross-sectional view of attaching the second packaged die shown in FIG. 20 to a first packaged die shown in FIG. 5 in accordance with an embodiment.
Figure 22:
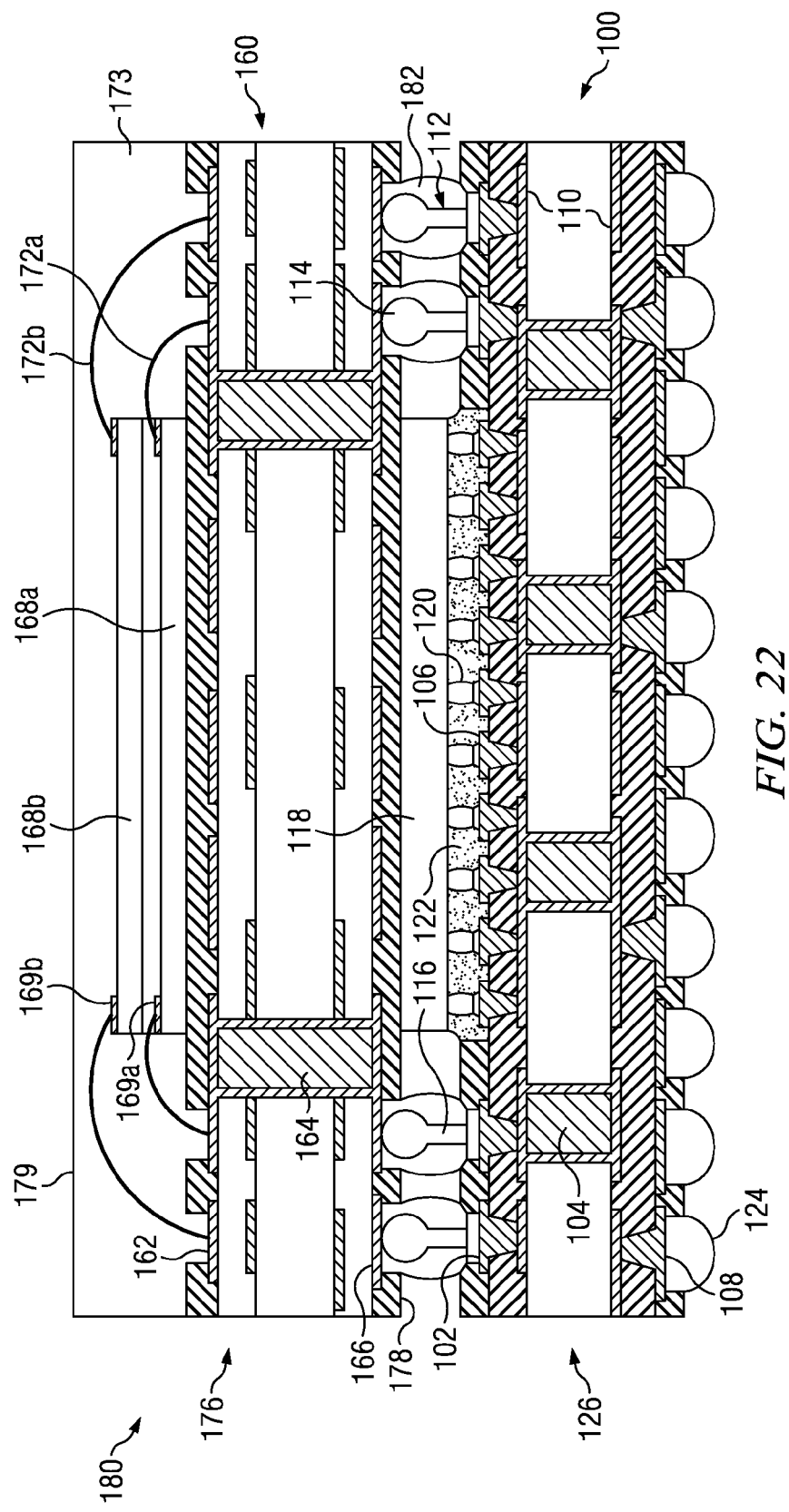
FIG. 22 is a cross-sectional view of a PoP device packaged in accordance with the embodiment shown in FIG. 21.

Embodiments of the present disclosure are related to packaging of semiconductor devices. Novel packaging structures and methods of packaging multiple semiconductor devices in PoP packages will be described herein. A first die 118 is packaged to form a first packaged die 126, shown in FIG. 5, and one or more second dies 168a and/or 168b are packaged to form a second packaged die 176, as shown in FIG. 20. The second packaged die 176 is packaged with the first packaged die 126, forming a PoP device 180, as shown in FIGS. 21 and 22, to be described further herein. Note that for simplification, not all element numbers are included in each subsequent drawing; rather, the element numbers most pertinent to the description of each drawing are included in each of the drawings.

Figure 1:
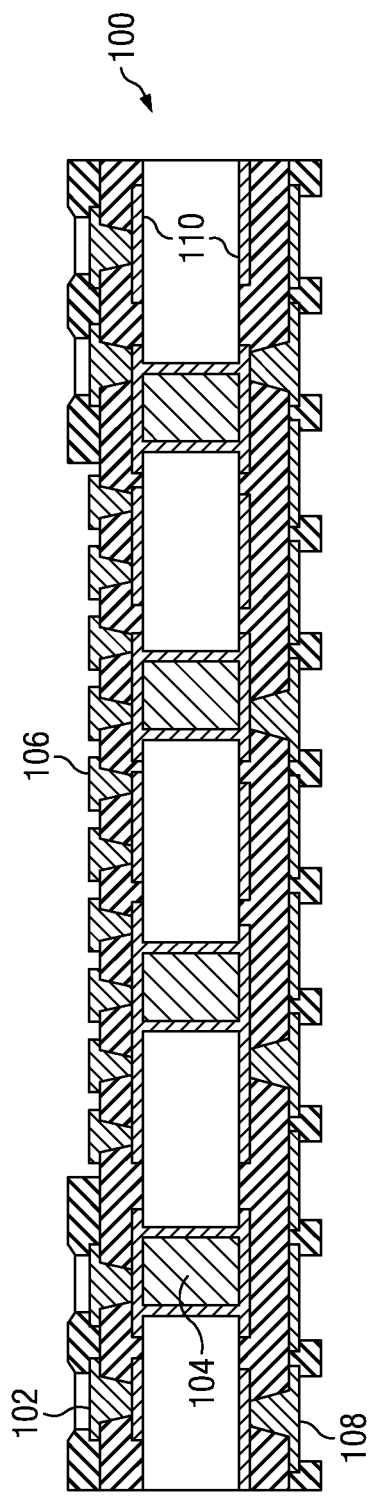
FIGS. 1 through 5 show cross-sectional views of a method of packaging a first die and forming metal stud bumps having a stick region and a ball region on a top surface thereof at various stages in accordance with an embodiment of the present disclosure.

FIGS. 1 through 5 show cross-sectional views of a method of packaging the first die 118 and forming metal stud bumps 112 on a top surface thereof at various stages in accordance with an embodiment of the present disclosure. Referring first to FIG. 1, a first substrate 100 is provided. Only one first substrate 100 is shown in the drawings; however, several first substrates 100 are processed on a workpiece 101 (see FIG. 6) comprising a plurality of first substrates 100, and the workpiece 101 is later singulated, after packaging first dies 118 on the first substrates 100.

The first substrate 100 comprises an interposer comprised of an insulating material or glass in some embodiments. In other embodiments, the first substrate 100 comprises a semiconductive material such as a semiconductor wafer. The first substrate 100 comprises an organic solderability preservative (OSP) material in some embodiments. The first substrate 100 may include electronic components and elements formed thereon in some embodiments, or alternatively, the first substrate 100 may be free of electronic components and elements.

Bond pads 102 are formed on the top surface of the first substrate 100 in a peripheral region of the first substrate 100. Bond pads and/or traces 106 are formed on the top surface of the first substrate 100 in a central region of the first substrate 100. Bond pads 108 are formed on the bottom surface of the first substrate 100. The bond pads 108 may be arranged in an array or in rows or columns on the bottom surface of the first substrate 100, not shown. The bond pads 108 may fully populate the bottom surface or may be arranged in various patterns, such as patterns used in ball grid array (BGA) or land grid array (LGA) package devices, as examples. The bond pads 102, bond pads and/or traces 106, and bond pads 108 comprise a conductive material such as Al, Cu, Au, alloys thereof, other materials, or combinations and/or multiple layers thereof, as examples. Alternatively, the bond pads 102, bond pads and/or traces 106, and bond pads 108 may comprise other materials.

The first substrate 100 includes a plurality of through-substrate vias (TSVs) 104 formed therein in some embodiments. The TSVs 104 comprise conductive or semiconductive material that extends completely through the first substrate 100 may be lined with an insulating or conductive material. The TSVs 104 provide vertical electrical connections (e.g., y-axis connections in FIG. 1) from a bottom surface to a top surface of the first substrate 100.

The first substrate 100 includes wiring 110 formed within one or more insulating material layers. The wiring 110 provides horizontal electrical connections (e.g., x-axis connections in the view shown in FIG. 1) in some embodiments, for example. The wiring 110 may include fan-out regions that include traces of conductive material for expanding the footprint of a first die (not shown in FIG. 1: see first die 118 in FIG. 3) to a footprint of the bottom side of the first substrate 100, e.g., of the bond pads 108. The wiring 110 of the first substrate 100 may include one or more redistribution layers (RDLs). The RDLs may comprise one or more insulating layers and wiring layers. The RDLs may include inter-level dielectrics (ILDs) with wiring in metallization layers disposed or formed therein. The wiring 110 may comprise one or more vias and/or conductive lines, for example. The wiring 110 and the TSVs 104 may be formed using one or more subtractive etch processes, single damascene techniques, and/or dual damascene techniques, as examples. A portion of the wiring 110 may reside on the top and bottom surfaces of the first substrate 100; e.g., portions of the wiring 110 of the first substrate 100 may comprise bond pads 102, bond pads and/or traces 106, and bond pads 108 that are coupleable to other elements. Alternatively, the bond pads 102, bond pads and/or traces 106, and bond pads 108 may be formed separately and may be attached to portions of the wiring 110, in other embodiments.

Figure 2:
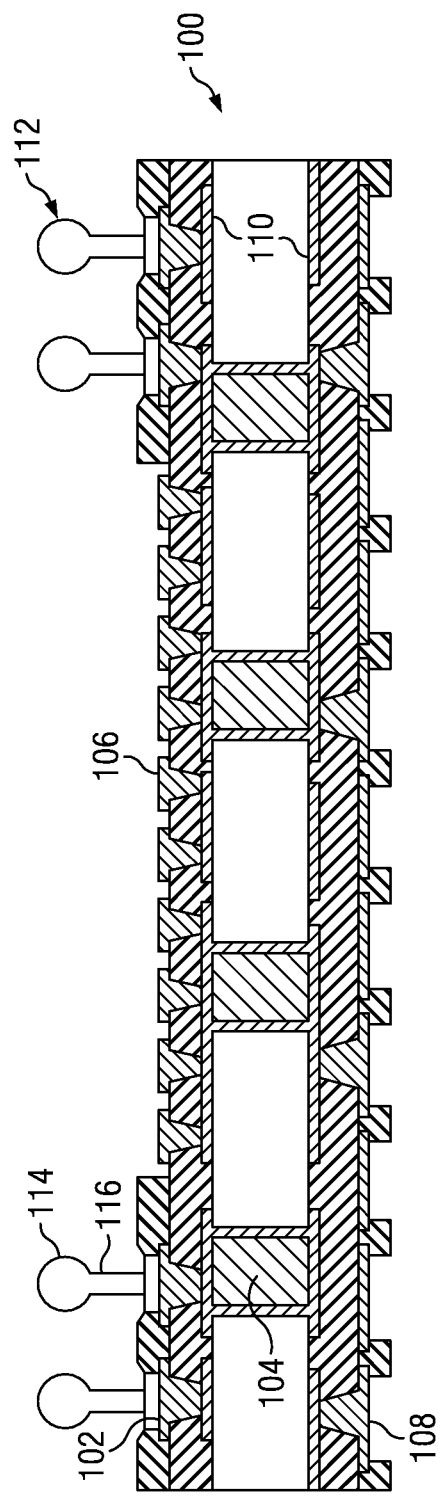

In accordance with embodiments of the present disclosure, a plurality of metal stud bumps 112 is attached to the bond pads 102 on the top surface of the substrate 100, as shown in FIG. 2. The plurality of metal stud bumps 112 may be attached using a method similar to a wire-bond method, e.g., using a wire bonder or a wire bonding machine (not shown). The metal stud bumps 112 include at least one ball region 114 and a stick region 116 coupled to the ball region 114. The ball region 114 comprises a ball shape, and the stick region 116 comprises an elongated "stick" shape.

The plurality of metal stud bumps 112 comprises a conductive material, such as a metal. In some embodiments, the plurality of metal stud bumps 112 comprises Cu, Al, Au, Pt, Pd, and/or combinations thereof, for example. In some embodiments, the metal stud bumps 112 comprise Cu stud bumps plated with Pd, as another example. Alternatively, the metal stud bumps 112 may comprise other conductive materials and/or metals. Each of the plurality of metal stud bumps 112 comprises a height of about 150 to 800 μm, in some embodiments. Alternatively, plurality of metal stud bumps 112 may comprise other materials and dimensions. The formation of the metal stud bumps 112 and the dimensions thereof will be described further herein with reference to FIGS. 10 through 19.

Figure 3:
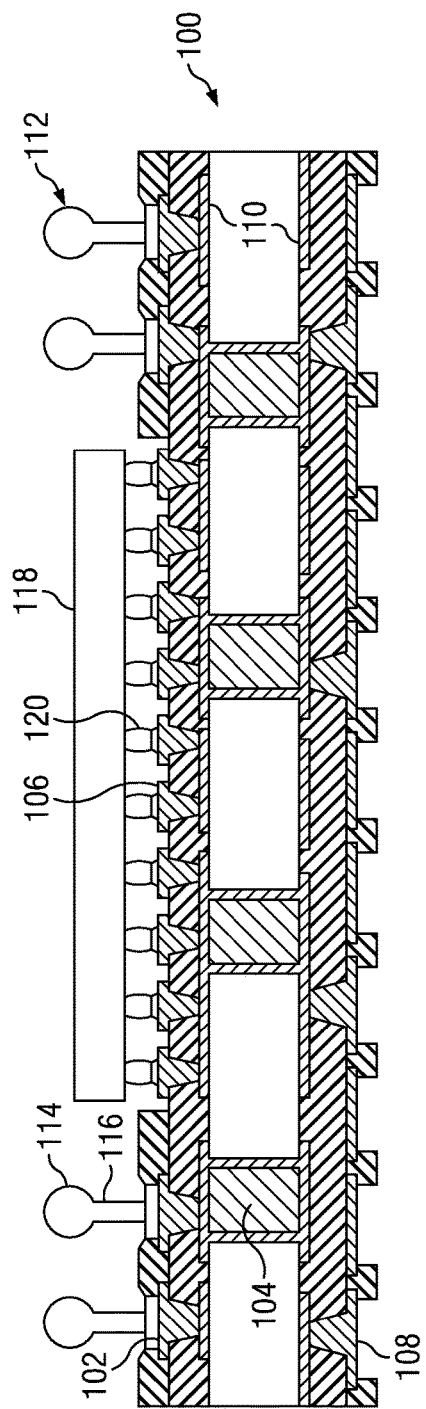

Next, a first die 118 is provided and is attached to the first substrate 100, as shown in FIG. 3. The first die 118 comprises an integrated circuit or chip that will be packaged with a second die 168a and in some embodiments also packaged with a third die 168b in a single PoP device 180 (see FIG. 20). The first die 118 may include a workpiece that includes a semiconductor substrate comprising silicon or other semiconductor materials and may be covered by an insulating layer, for example. The first die 118 may include one or more components and/or circuits formed in and/or over the workpiece, not shown. The first die 118 may include conductive layers and/or semiconductor elements, e.g., transistors, diodes, capacitors, etc., also not shown. The first die 118 may comprise logic circuitry, memory devices, or other types of circuits, as examples. The first die 118 may include a plurality of contacts (not shown) formed on a bottom surface thereof.

A plurality of solder bumps 120 is formed on the bottom surface of the first die 118, e.g., on the plurality of contacts on the bottom surface of the first die 118. The solder bumps 120 may comprise microbumps or solder balls, as examples. The solder bumps on the first die 118 are then attached to the bond pads and/or traces 106 on the top surface of the first substrate 100, as shown in FIG. 3. A solder reflow process is used to reflow the solder of the solder bumps 120 and attach the first die 118 to the first substrate 100, electrically and mechanically attaching the solder bumps 120 to the bond pads or traces 106 of the first substrate 100, for example. The solder bumps 120 may alternatively be attached to the first substrate 100 using other methods.

In some embodiments, the first die 118 is attached to the first substrate 100 using a flip-chip bond-on-trace (BOT) attachment technique. Alternatively, other flip-chip attachment techniques and other types of bond pads 106 may be used.

Figure 4:
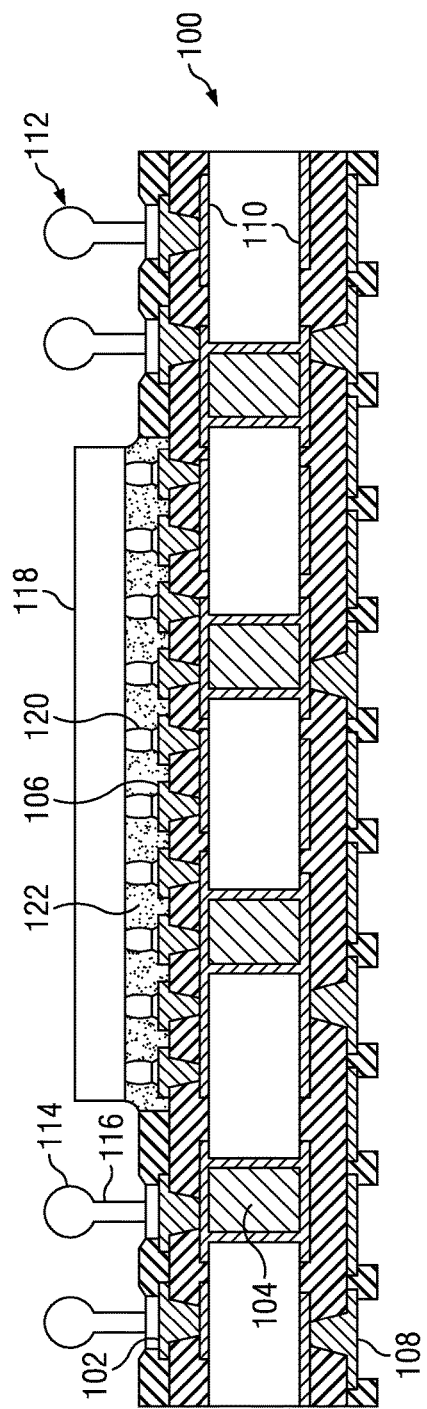

An underfill material 122 is then applied under the first die 118 between the first substrate 100 and the first die 118, as shown in FIG. 4. The underfill material 122 is applied using a dispensing needle along one or more edges of the first die 118, for example, although other methods may also be used to form the underfill material 122. The underfill material 122 comprises epoxy or a polymer in some embodiments, although other materials may alternatively be used.

Figure 5:
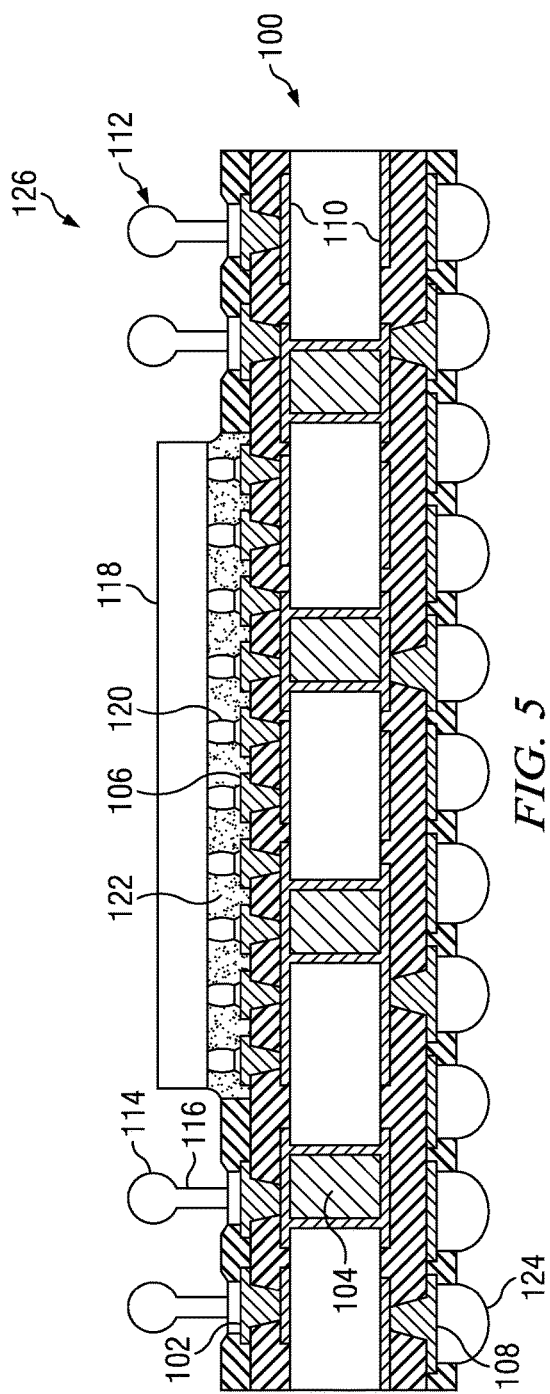

A plurality of solder balls 124 is then formed on the bottom surface of the first substrate 100, as shown in FIG. 5. The solder balls 124 are attached to the bond pads 108 on the bottom of the first substrate 100. The solder balls 124 may be formed using a ball mount process, followed by a solder reflow process, for example. The solder balls 124 may alternatively be formed using other methods. In some embodiments, metal pads (not shown), rather than solder balls, may be formed on the bottom surface of the first substrate 100 over the bond pads 108, for a subsequent level interconnect process.

The first substrate 100 is then singulated from other first substrates 100 on the workpiece 101, forming a first packaged die 126. The first packaged die 126 is also referred to herein as a bottom packaged die in some embodiments, for example. The bottom packaged die 126 comprises a plurality of bond pads 102 on the top surface thereof, and also includes a plurality of solder balls 124 formed on bond pads 108 on the bottom surface thereof. Each of the plurality of metal stud bumps 112 is bonded to a bond pad 102 on the top surface of the bottom packaged die 126. Final tests are then performed on the first or bottom packaged die 126.

Figure 6:
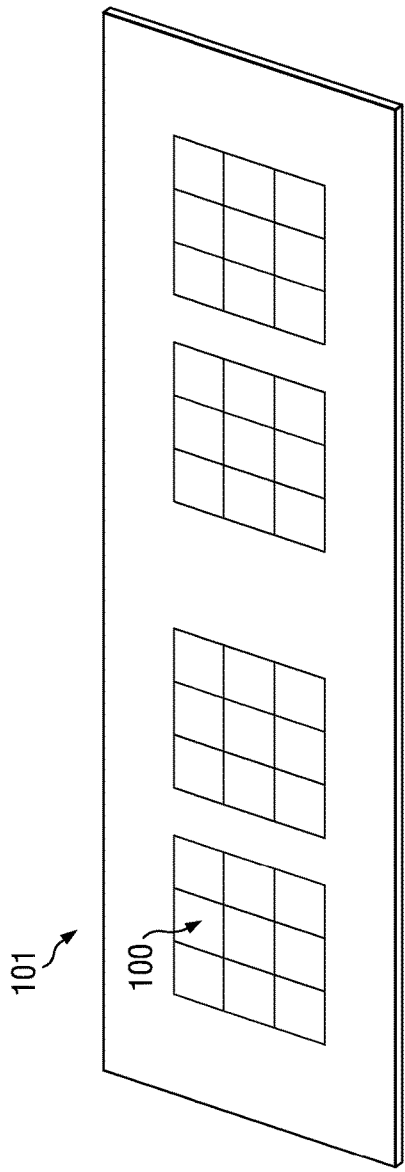
FIG. 6 is a perspective view illustrating a workpiece including a plurality of first substrates disposed thereon in accordance with an embodiment.

FIG. 6 is a perspective view illustrating a workpiece 101 that includes a plurality of first substrates 100 disposed thereon in accordance with an embodiment. The workpiece 101 is rectangular and the first substrates 100 are formed thereon in several groups of nine in a 3×3 matrix, in some embodiments. The first substrates 100 may alternatively be arranged on the workpiece 101 in other arrangements and patterns, for example.

Figure 7:
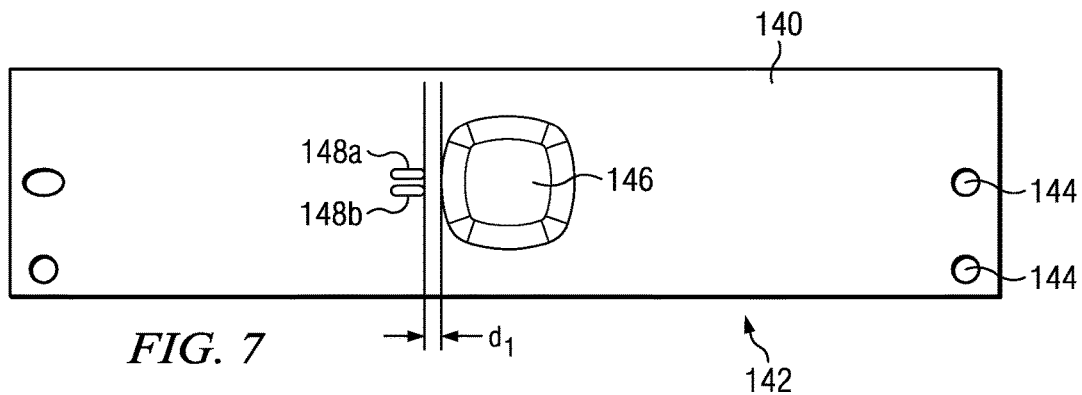
FIG. 7 is a top view of a window clamp and a heat block in accordance with an embodiment.

FIG. 7 is a top view of a window clamp 140 and a heat block 142 in accordance with an embodiment. The window clamp 140 and heat block 142 comprise a kit that is used to form the metal stud bumps 112. The heat block 142 comprises a bottom plate, and the window clamp 140 comprises a top cover for the workpiece 101, for example. The workpiece 101 is placed on the heat block 142, and the window clamp 140 is placed over the workpiece 101.

Figure 8:
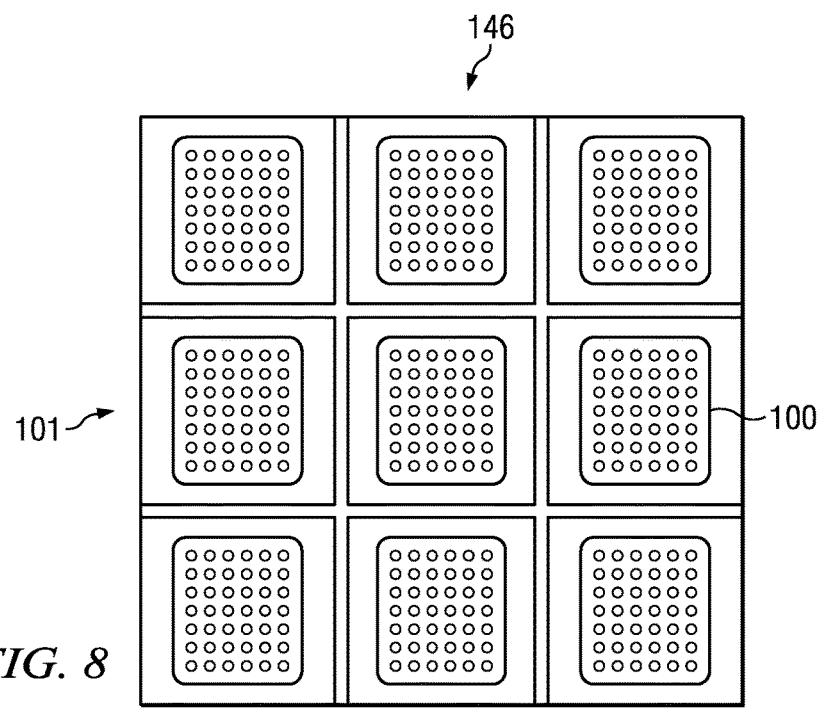
FIG. 8 illustrates a portion of the workpiece shown in FIG. 6 that is exposed through a window of the window clamp shown in FIG. 7.

The window clamp 140 includes a plurality of holes 144 for aligning and positioning the window clamp 140 to the workpiece 101 and heat block 142. The window clamp 140 may comprise an alloy tool steel such as SKS3 or other materials, for example. The window clamp 140 holds the workpiece 101 in place during the metal stud bump 112 formation on the bond pads 102 of the first substrates 100. A region of the workpiece 101 is exposed through a window 146 in the window clamp 140 during the processing of the first substrates 100. The window 146 may be large enough to expose a single first substrate 100 or to expose a plurality of first substrates 100. As one example, FIG. 8 illustrates a portion of the workpiece 101 shown in FIG. 6 that is exposed through the window 146 of the window clamp 140 shown in FIG. 7, wherein the window 146 exposes a 3×3 matrix of nine first substrates 100 in accordance with an embodiment. The window 146 may comprise a dimension of about 14.5×14.5 mm, for example, although alternatively, the window 146 may comprise other dimensions. The window 146 extends completely through the thickness of the window clamp 140 to expose the portion of the workpiece 101 being processed. The window 146 in the window clamp 140 may have beveled edges. The window clamp 140 is repositioned over various portions of the workpiece 101, and the processing is sequentially repeated for each portion of the workpiece 101 to attach the metal stud bumps 112 to each of the first substrates 100. A plurality of spacers (not shown) is disposed between the window clamp 140 and the workpiece 101 to avoid damaging the metal stud bumps 112 after they are formed on each portion of the workpiece 101.

Referring again to FIG. 7, in accordance with an embodiment, the window clamp 140 includes two apertures 148*a* and 148*b*. The apertures 148*a* and 148*b* comprise grooves in the window clamp 140 that extend partially through the window clamp 140. The apertures 148*a* and 148*b* may comprise elongated grooves as shown, or alternatively, the apertures 148*a* and 148*b* may comprise oval, circular, or other shapes, as examples, not shown. The apertures 148*a* and 148*b* are used to form the metal stud bumps 112, to be described further herein. The apertures 148*a* and 148*b* are disposed in the window clamp 140 proximate the window 146. The apertures 148*a* and 148*b* are spaced apart from the window 146 in some embodiments by a dimension $d_1$ comprising about 0.080". Alternatively, dimension $d_1$ may comprise other values. The apertures 148*a* and 148*b* are included in the window clamp 140 for a free air ball (FAB) looping profile application that is used to form the metal stud bumps 112 in some embodiments, for example.

Figure 9:
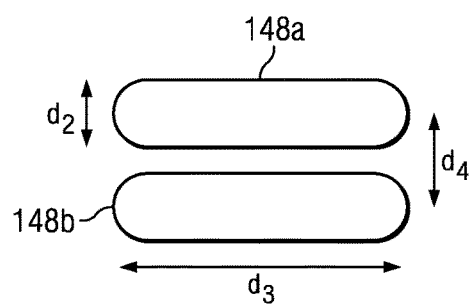
FIG. 9 shows dimensions of apertures formed in the window clamp shown in FIG. 7.

FIG. 9 illustrates dimensions of the apertures 148*a* and 148*b* formed in the window clamp 140 shown in FIG. 7. The apertures 148*a* and 148*b* each comprise a width comprising dimension $d_2$, which comprises about 0.020" in an embodiment. Dimension $d_2$ is greater than a width of a ball region 114 of the metal stud bumps 112, for example. The apertures 148*a* and 148*b* comprise a length comprising dimension $d_3$ which comprises about 0.1" in an embodiment. A center of the first aperture 148*a* is spaced apart from a center of the second aperture 148*b* by a dimension $d_4$ which comprises about 0.030" in an embodiment. Alternatively, dimensions $d_2$, $d_3$, and $d_4$ may comprise other values.

FIGS. 10 and 11 illustrate cross-sectional views of a method of forming metal stud bumps 112 shown in FIG. 2 in accordance with an embodiment. The metal stud bumps 112 are formed using a wire bonder or wire bonding machine that includes a capillary 132 for dispensing a metal wire 133, an electric flame off (EFO) wand 138 (see FIG. 12), and a transducer (the wire bonder and some elements thereof are not shown in the figures). A portion 130 of the wire bonder is shown in FIG. 10 with a wire 133 disposed inside a capillary 132. The wire 133 comprises a diameter of about 1 to 10 mils, for example. The capillary 132 is adapted to control and move the wire 133 during the formation of the metal stud bumps 112 and the bonding process of the metal stud bumps 112 to the first substrates 100. The wire 133 comprises Cu, Al, Au, Pt, Pd, and/or combinations thereof, for example. In some embodiments, the wire comprises Cu plated with Pd, as an example. Alternatively, the wire 133 may comprise other conductive materials and/or metals and dimensions.

An end 134 of the wire 133 protrudes from the tip of the capillary 132. The EFO wand 138 is used to create an electrical spark 136 proximate the end 134 of the wire 133, which forms a ball region 114 at the end 134 of the wire 133, as shown in FIG. 11. The ball region 114 is formed using a formed free air ball (FAB) technique in an embodiment. The wire 133 is extended from the capillary to the ball region 114 by a predetermined amount comprising dimension $d_8$ which is the length of the stick region 116 of the metal stud bumps 112.

FIGS. 12 through 17 are cross-sectional views illustrating a method of forming metal stud bumps 112 on the first substrates 100 using the window clamp 140 at various stages in accordance with an embodiment. Before the metal stud bumps 112 are attached to bond pads 102 (not shown in FIGS. 12 through 17; see FIGS. 1 through 5), a pre-solder material such as a solder paste, not shown, may be formed over the bond pads 102 of the first substrates 100 on the workpiece 101, to facilitate the bonding of the metal stud bumps 112 to the bond pads 102 on the first substrates 100.

In FIG. 12, the capillary 132 of the wire bonder is shown proximate an EFO wand 138. The EFO wand 138 location comprises absolute coordinates in an embodiment, for example. The electrical spark 136 from the EFO wand 138 forms the ball region 114. The heat block 142, workpiece 101, and window clamp 140 are also shown. One or more first substrates 100 are exposed through the window 146 in the window clamp 140.

Figure 13:
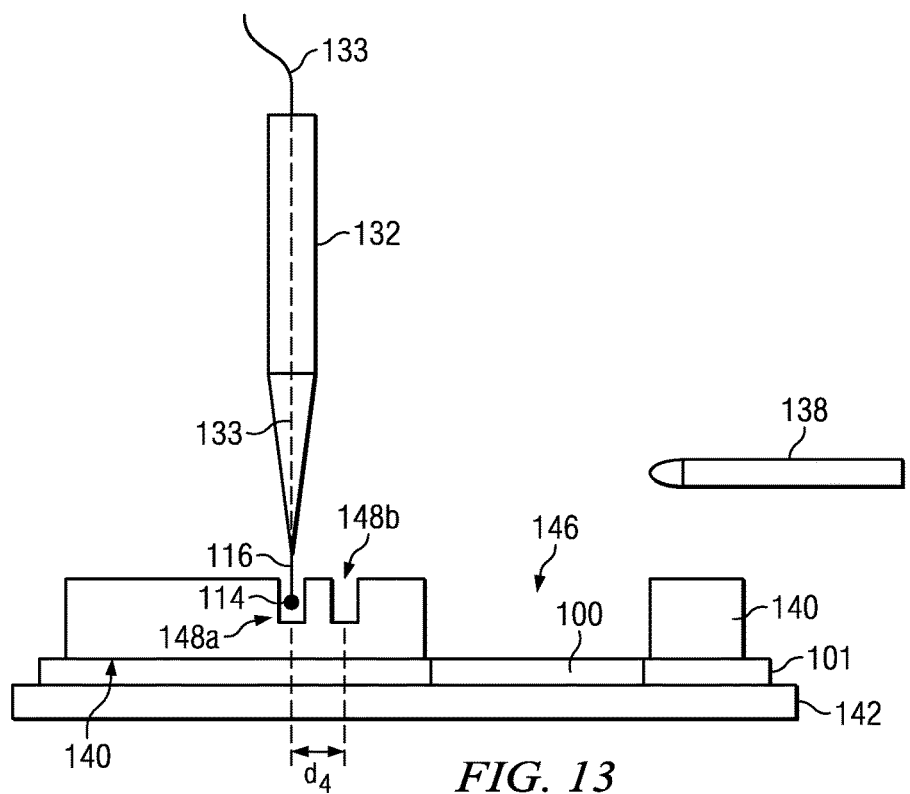
Figure 14:
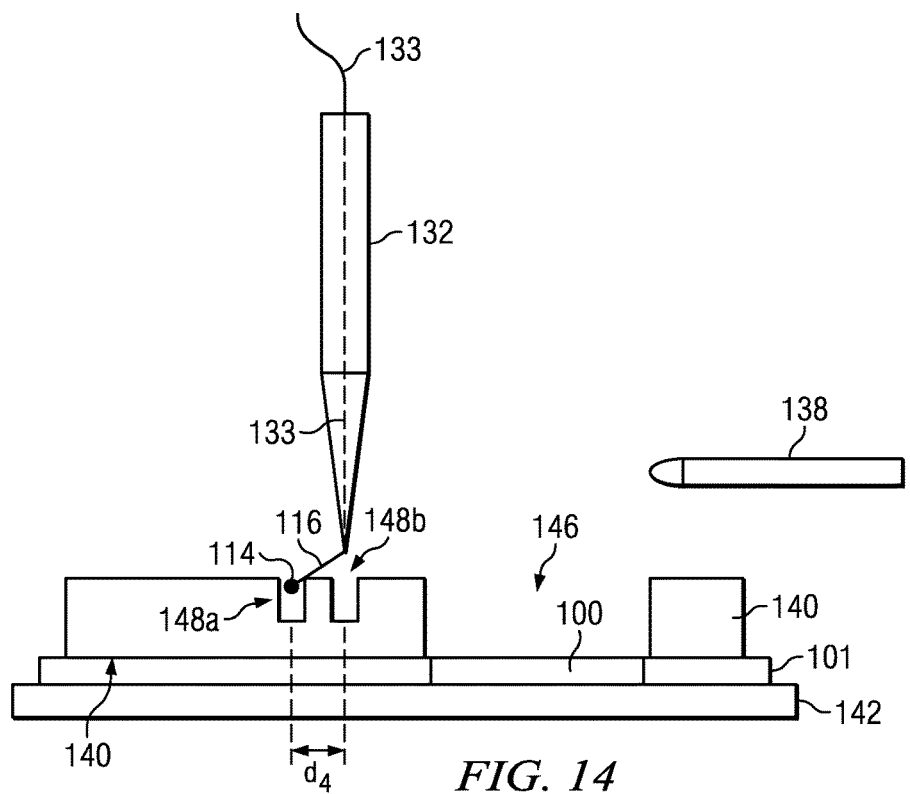
Figure 15:
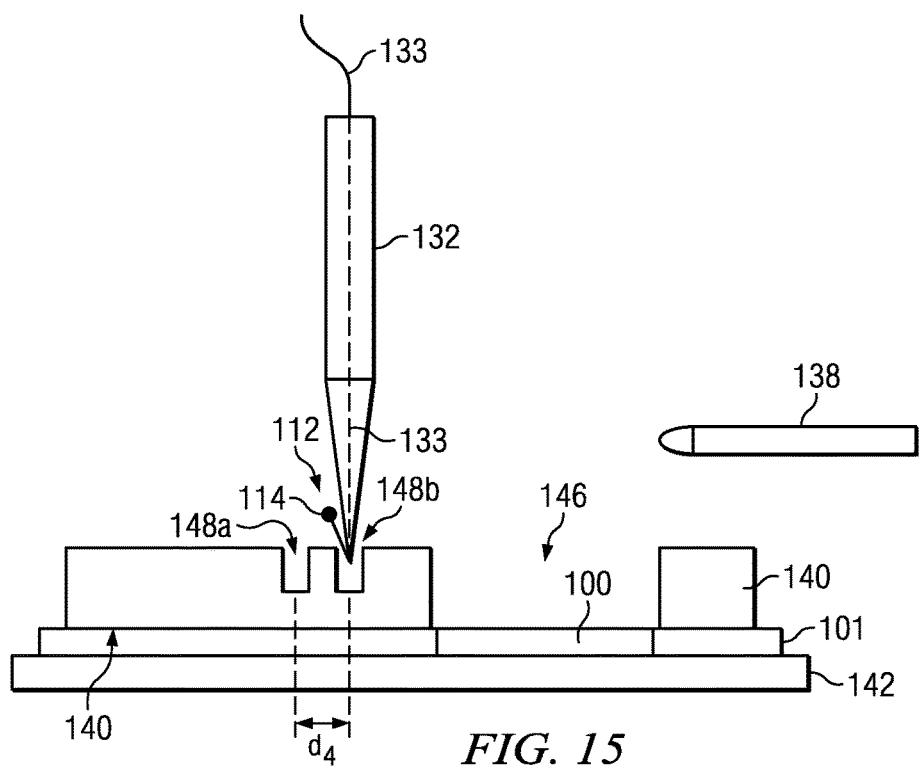

After the ball region 114 is formed at the end of the wire 133, the capillary 132 moves the ball region 114 at the end of the wire 133 to the first aperture 148a and inserts the ball region 114 into the first aperture 148a, as shown in FIG. 13. The wire bonder includes robotics and/or a motor adapted to move the capillary 132 to the desired location, for example, not shown. The first aperture 148a comprises a form location absolute coordinate location in an embodiment, for example. The capillary 132 moves in an x-y direction to the second aperture 148b, as shown in FIG. 14, and inserts the end of the wire 133 into the second aperture 148b, as shown in FIG. 15, bending the wire 133. The distance between the first aperture 148a and 148b comprising dimension $d_4$ is selected to achieve and define a desired length of the stick region 116 comprising dimension $d_8$, for example. Aperture 148b is located in a position comprising a form distance relative to form location, e.g., relative to aperture 148a, for example.

Figure 16:
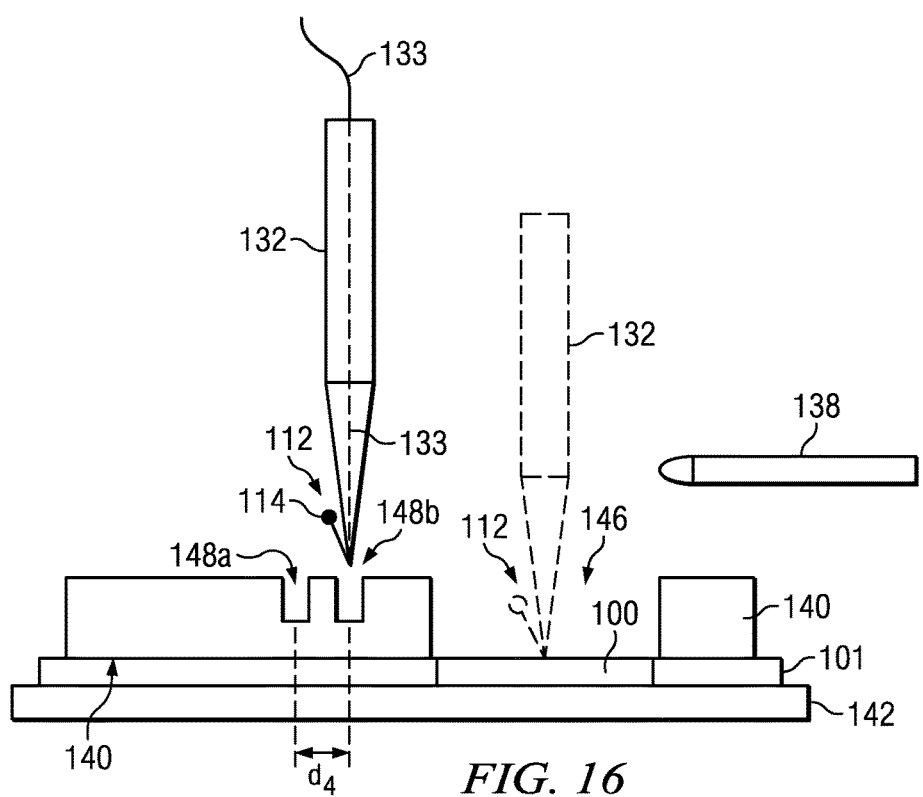
Figure 17:
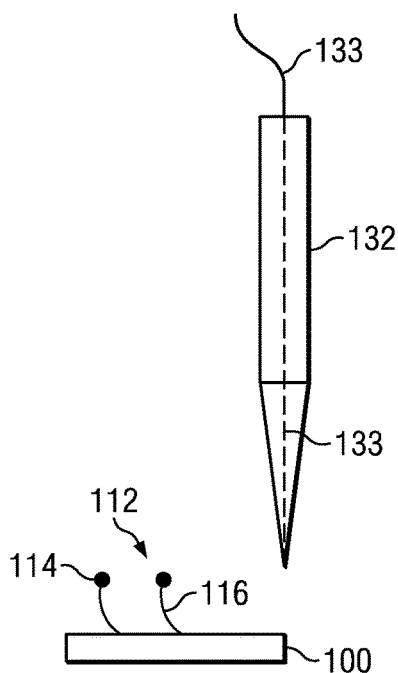

The capillary 132 is then moved to the top surface of the first substrate 100 that is exposed through the window 146 where a metal stud bump 112 will be formed, as shown in phantom in FIG. 16. A distance is cleared relative to the last position at the form distance at aperture 148b to the window 146, for example. The capillary 132 vibrates the end of the stick region 116 of the metal stud bump 112 in a horizontal direction in the view shown in FIG. 16 using ultrasonic vibration or power. The capillary 132 also applies a force against a bond pad 102 (not shown in FIG. 16; see FIG. 2) on the first substrate 100, and heat is applied to the first substrate 100 using the heat block 142, attaching the end of the stick region 116 of the metal stud bump 112 to the bond pad 102 on the first substrate 100. The capillary 132 is then removed, leaving a metal stud bump 112 attached or bonded to the first substrate 100 on top of the bond pad 102, as shown in a cross-sectional view in FIG. 17. The process is continued for other bond pads 102 on the surface of the first substrates 100. Alternatively, the metal stud bumps 112 may be formed and bonded to the first substrates 100 on the workpiece 101 using other methods, for example.

Figure 18:
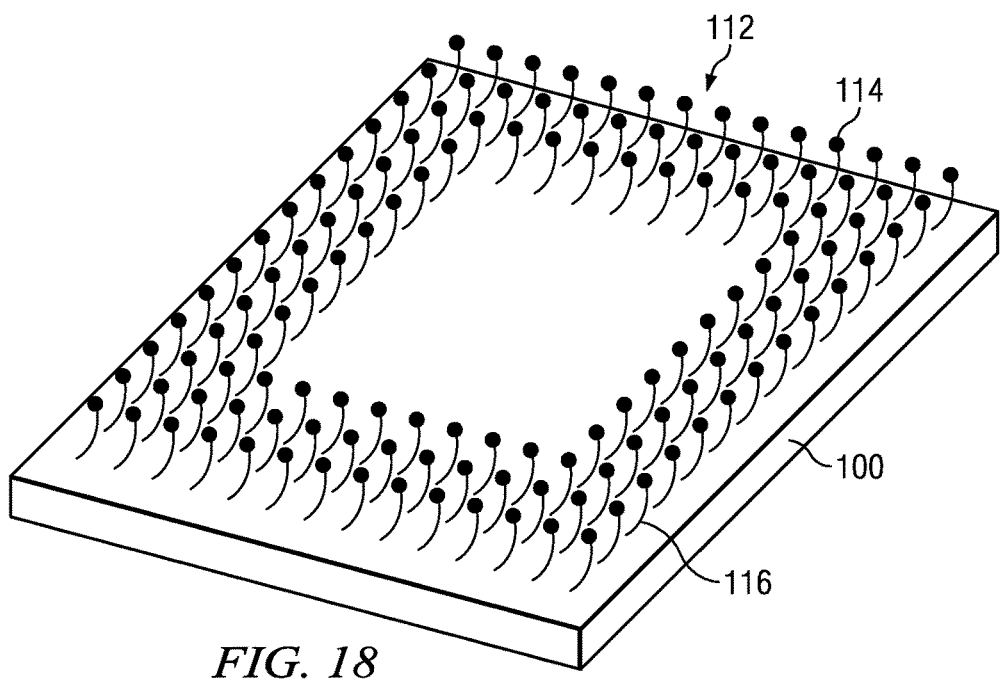
FIG. 18 is a perspective view illustrating a plurality of the metal stud bumps formed on a first substrate in accordance with an embodiment.

FIG. 18 is a perspective view illustrating a plurality of the metal stud bumps 112 formed on a first substrate 100 in accordance with an embodiment. The metal stud bumps 112 are formed in one or more rows in a peripheral region of the first substrate 100. The metal stud bumps 112 are flexible in some embodiments, particularly during the formation and bonding process when heat is applied. The metal stud bumps 112 have a predetermined degree of stiffness that prevents the metal stud bumps 112 from being deformed easily. However, care should be taken during the fabrication process and during transportation, before the first packaged die 126 (see FIG. 5) is packaged with another packaged die, to prevent any unexpected mechanical, manual damage, or deformation of the metal stud bumps 112. The stick regions 116 of the metal stud bumps 112 may not be entirely straight, but rather, the stick regions 116 may curve slightly at the bottom where they are attached to the first substrate 100 and at the top proximate the ball region 114, in some embodiments. The flexible metal stud bumps 112 are spring-like and can be elastically or plastically deformed when compressed with a predetermined limited amount of force in some embodiments, for example. The novel metal stud bumps 112 may be formed on a bond pitch of about 50 to 350 μm, in some embodiments, for example.

Figure 19:
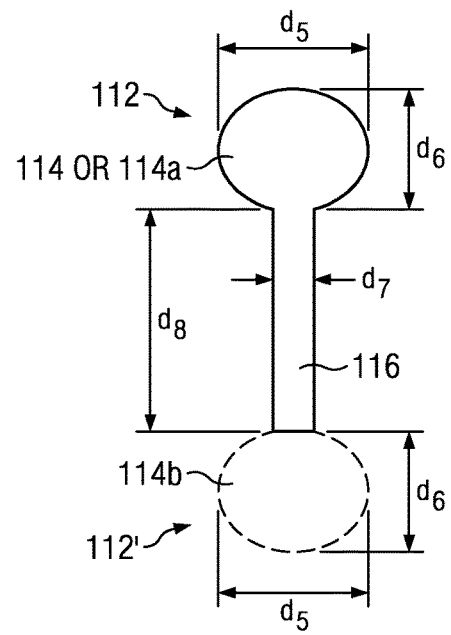
FIG. 19 is a cross-sectional view of a metal stud bump, illustrating dimensions of the metal stud bumps in accordance with an embodiment.

FIG. 19 is a cross-sectional view of a metal stud bump 112, illustrating various dimensions of the metal stud bumps 112 in accordance with an embodiment. The ball region 114 comprises a width comprising dimension $d_5$ of about 1.2 to 3.0 times wire diameter $d_7$ and a height comprising dimension $d_6$ of about 50 to 150 μm, as examples. In some embodiments, dimension $d_5$ comprises about 50 to 150 μm, as another example. The stick region 116 comprises a width or diameter comprising dimension $d_7$ of about 1 to 10 mils and a height comprising dimension $d_8$ of about 100 to 500 μm, as examples. Alternatively, dimensions $d_5$, $d_6$, $d_7$, and $d_8$ may comprise other values. In some embodiments, the overall height of the metal stud bumps 112 is about 100 to 500 μm, as another example.

In some embodiments, a ball region 114a and 114b is formed at both ends of the stick region 116, forming a metal stud bump 112', as shown in phantom in FIG. 19. The first ball region 114a is formed as described with reference to FIGS. 10 and 11, and the stick region 116 is formed as described with reference to FIGS. 11 through 15 that is coupled to the first ball region 114a at a first end of the stick region 116. The capillary 132 is moved again to the EFO wand 138, and an electrical spark 136 is used to create a second ball region 114b coupled at a second end of the stick region 116 that is opposite the first end of the stick region 116 that the first ball region 114a is coupled to. The capillary 132 may extend the wire 133 an additional amount to form the second ball region 114b, in some embodiments, for example. The second ball region 114b comprises similar dimensions $d_5$ and $d_6$ as described for ball region 114, for example.

After the metal stud bumps 112 have been coupled to the first substrate 100, next, a second packaged die 176 is provided, as shown in FIG. 20 in a cross-sectional view. The second packaged die 176 includes at least one second die 168a or 168b coupled to a second substrate 160. In some embodiments, the second packaged die 176 includes a plurality of second dies 168a and 168b coupled to the second substrate 160, as shown in FIG. 20. The second dies 168a and 168b may be packaged using a method described in U.S.

patent application Ser. No. 13/483,734, filed on May 30, 2012, entitled, "Package on Package Devices and Methods of Packaging Semiconductor Dies," which application is incorporated herein by reference (e.g., see FIGS. 16 through 19 and descriptions thereof in the related application). Alternatively, the second packaged die 176 may be packaged using other methods.

The second packaged die 176 includes a second substrate 160 which may comprise a substrate similar to the first substrate 100 described herein and which may comprise similar materials and components. The second substrate 160 may include TSVs 164 and wiring 170 similar to the TSVs 104 and wiring 110 described for the first substrate 100. The second substrate 160 includes contact pads 162 on the top surface in a perimeter region and contacts 166 on the bottom surface. The contact pads 162 and contacts 166 may comprise similar materials described for the bond pads 102, bond pads or traces 106, and bond pads 108 of the first substrate 100, for example.

A second die 168a comprising a die similar to that described for the first die 118 is attached to the top surface of the second substrate 160. The second die 168a includes a plurality of contacts 169a on a top surface thereof in a perimeter region. The second die 168a is attached to the top surface of the second substrate 160 using a glue or adhesive, not shown. The second die 168a is then electrically connected to the second substrate 160 using wire bonds 172a along two or more edges of the second die 168a. The second die 168a may be wire bonded along all four edges to the second substrate 160, for example. Contacts 169a on a top surface of the second die 168a are wire-bonded by wire bonds 172a to contact pads 162 on the top surface of the second substrate 160. In some embodiments, one second die 168a is coupled to the second substrate 160, and then a molding compound 173 is formed over the second die 168a and top surface of the second substrate 160, not shown in the drawings. In other embodiments, two second dies 168a and 168b are coupled over the second substrate 160, as shown in FIG. 20. A plurality of second dies 168a and 168b are stacked vertically above the second substrate 160, for example.

The second die 168b is also referred to herein as a third die. The third die 168b is coupled over the second die 168a, e.g., attached to the top surface of the second die 168a using a glue or adhesive. Contacts 169b on a top surface of the third die 168b are wire bonded by wire bonds 172b to contact pads 162 on the top surface of the second substrate 160. Two or more rows of contact pads 162 may be formed on the top surface of the second substrate 160. The innermost row of contact pads 162 is wire bonded to the second die 168a, and the outer-most row of contact pads 162 is wire bonded to the third die 168b. A molding compound 173 is formed over the third die 168b and exposed portions of the second substrate 160. The molding compound 173 comprises an insulating material that protects the wire bonds 172a and 172b, for example. The second dies 168a and 168b are packaged on the second substrate 160 using a flip-chip wafer level packaging (WLP) technique and wire bonding process in some embodiments, for example. Alternatively, the second dies 168a and 168b may be packaged on the second substrate 160 using other types of packaging processes.

In some embodiments, a plurality of solder balls 174 is formed on the bottom surface of the second substrate 160, e.g., the solder balls 174 are coupled to the contacts 166, as shown in FIG. 20. The second substrate 160 is singulated from other second substrates 160 on a workpiece (e.g., comprising a strip or workpiece of second substrates 160) the second substrate 160 was fabricated on. The second packaged die 176 is also referred to herein as a top packaged die, for example. The top packaged die 176 includes the molding compound 173 at the top surface 179 thereof, and includes the solder balls 174 coupled to the contacts 166 at the bottom surface 178 thereof. Final tests are performed on the second packaged die 176.

FIG. 21 illustrates a cross-sectional view of attaching the second packaged die 176 to a first packaged die 126 in accordance with an embodiment. The second packaged die 176 is lowered until the solder balls 174 are coupled to the metal stud bumps 112. The solder balls 174 are reflowed so that a solder joint 182 is formed over at least a portion of each of the metal stud bumps 112, as shown in FIG. 22, which is a cross-sectional view of a PoP device 180 packaged in accordance with methods described herein. The solder joints 182 have a substantially barrel shape in the cross-sectional view. Each of the plurality of metal stud bumps 112 is embedded in a solder joint 182 in some embodiments. Alternatively, the solder joints 182 may form on a top portion of the metal stud bumps 112. The plurality of metal stud bumps 112 is disposed between the first packaged die 126 and the second packaged die 176. The solder joints 182 electrically couple together the bond pads 102 of the first packaged die 126 and the contacts 166 of the second packaged die 126, and also mechanically couple together the first and second packaged dies 126 and 176.

The solder joints 182 are formed in some embodiments by heating the first substrate 100 and the second substrate 160 to reflow a solder material of the plurality of solder balls 174 on the bottom surface 178 of the second substrate 160 and form the plurality of solder joints 182 between the first substrate 100 and the second substrate 160. At least some of the plurality of solder joints 182 includes one of the plurality of metal stud bumps 112. One illustrative process might include heating the first substrate 100 with the metal stud bumps 112 formed thereon (e.g., on a bottom packaged die 126) to above the solder melting point, which is about +10° C.; aligning a solder ball 174 (on a top packaged die 176); and placing it on top of the metal stud bump 112 to form a temporary joint, and following with a process to form a permanent solder joint 182, for example.

PoP device 180 total thicknesses of about 1 mm or less are achievable using the novel embodiments of the present disclosure described herein, for example. Alternatively, the PoP device 180 thicknesses may comprise other dimensions. PoP device 180 thicknesses may be decreased by about 10% or greater by the use of embodiments of the present disclosure.

Figure 23:
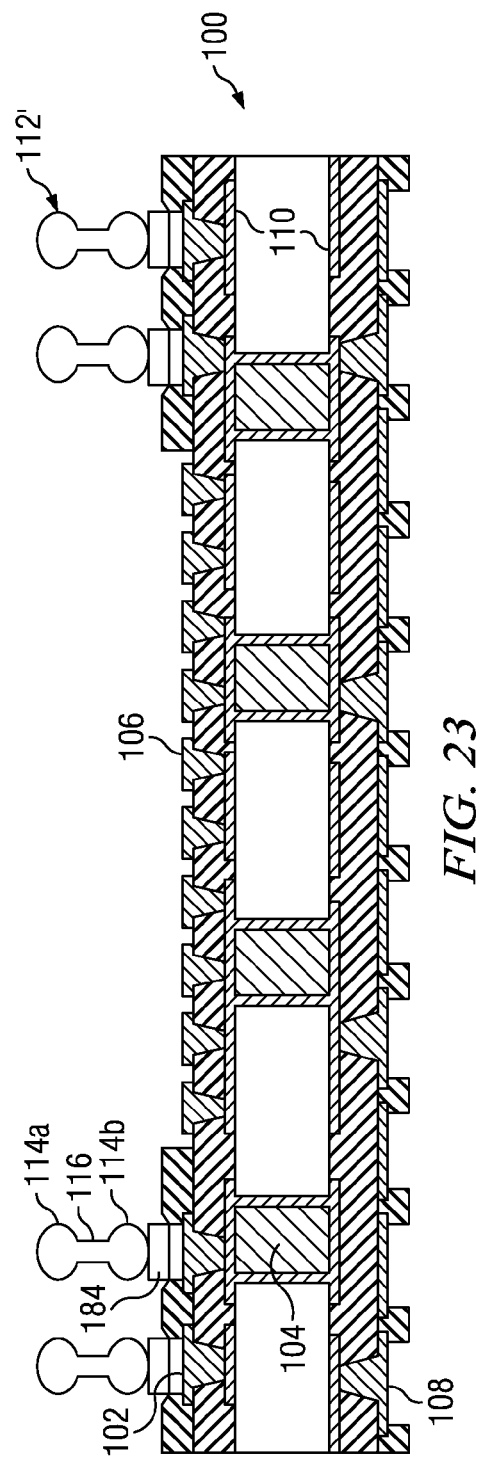
FIG. 23 is a cross-sectional view of a first substrate including metal stud bumps formed on a top surface thereof in accordance with another embodiment, wherein the metal stud bumps include two ball regions disposed at each end of a stick region.

FIG. 23 is a cross-sectional view of a first substrate 100 including metal stud bumps 112' formed on a top surface thereof in accordance with another embodiment, wherein the metal stud bumps 112' include two ball regions 114a and 114b disposed at each end of the stick region 116. The metal stud bumps 112' are formed using a method described for metal stud bumps 112' shown in FIG. 19 in phantom. FIG. 23 also shows a solder paste 184 that may be applied to the bond pads 102 on the top surface of the first substrate 100 in some embodiments, before the metal stud bumps 112' are attached to the bond pads 102. After the metal stud bumps 112' are attached to the solder paste 184, the solder paste 184 is reflowed by heating the first substrate 100. The heat block 142 disposed below the workpiece 101 may be used to heat the first substrate 100 above a melting point for the solder paste 184, for example. The solder paste 184 facilitates in adhering the metal stud bumps 112' to the bond pads 102. A solder paste 184 may also be implemented in the previous embodiment described herein.

Figure 24:
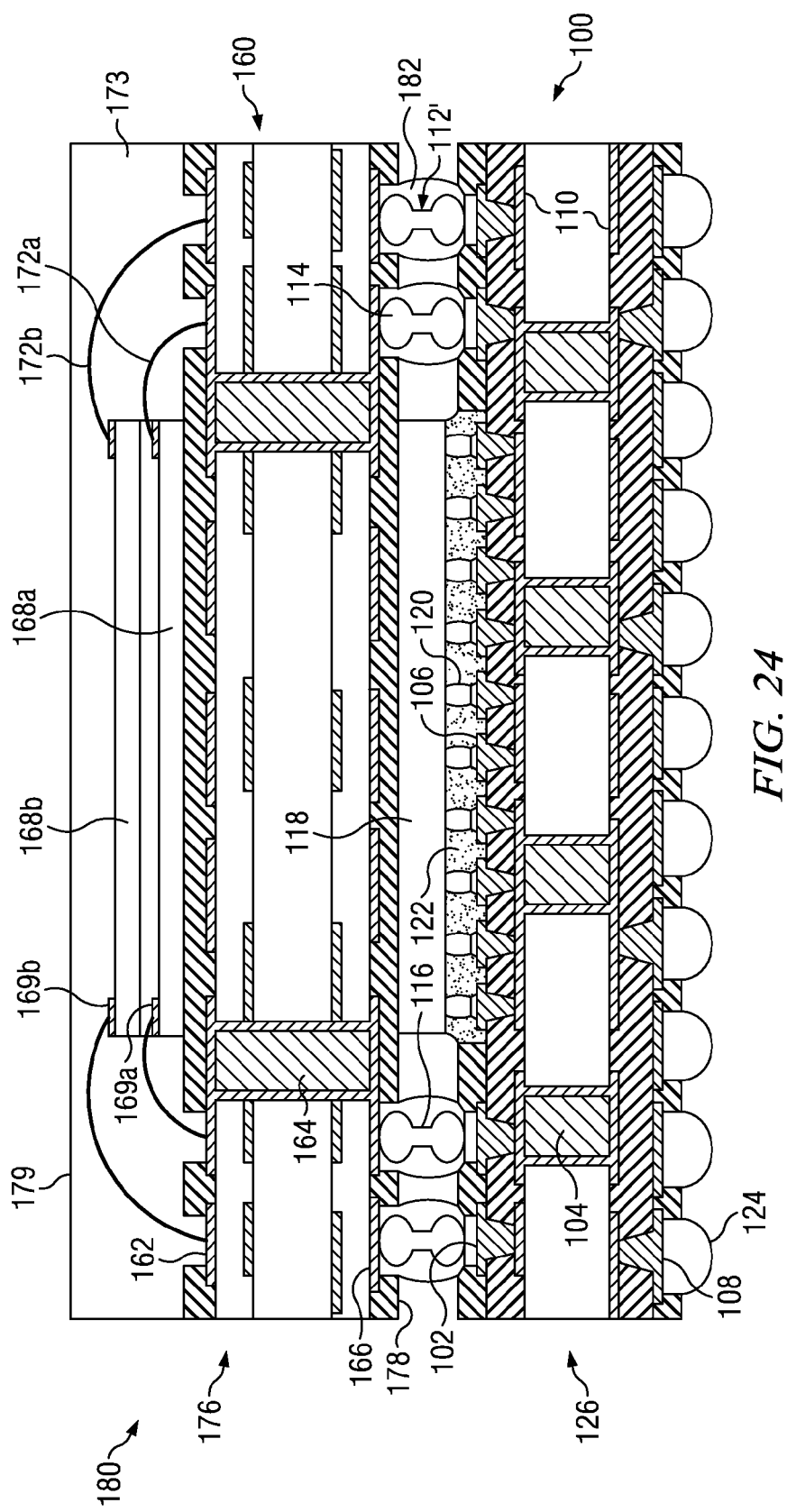
FIG. 24 is a cross-sectional view of a PoP device packaged in accordance with the embodiment shown in FIG. 23.

FIG. 24 is a cross-sectional view of a PoP device 180 packaged in accordance with the embodiment shown in FIG. 23. A first die 118 is attached to the first substrate 100 shown in FIG. 23, and the first die 118 is packaged on the first substrate 110 as described with reference to FIGS. 4 and 5. The first packaged die 126 including the metal stud bumps 112' is packaged with a second packaged die 176 shown in FIG. 20, and the solder balls 174 on the second packaged die 176 are reflowed, forming the PoP device 180 shown in FIG. 24. Each solder joint 182 includes a metal stud bump 112' having two ball regions 114a and 114b. The metal stud bumps 112' are at least partially covered by the solder material of the solder balls 174 in the solder joints 182.

In the embodiments described herein, the metal stud bumps 112 and 112' are formed on the bottom packaged die 126, and the solder balls 174 are formed on the top packaged die 176. Alternatively, in accordance with embodiments, the metal stud bumps 112 and 112' may be formed on the top packaged die 176, and the solder balls 174 may be formed on the bottom packaged die 126.

Figure 25:
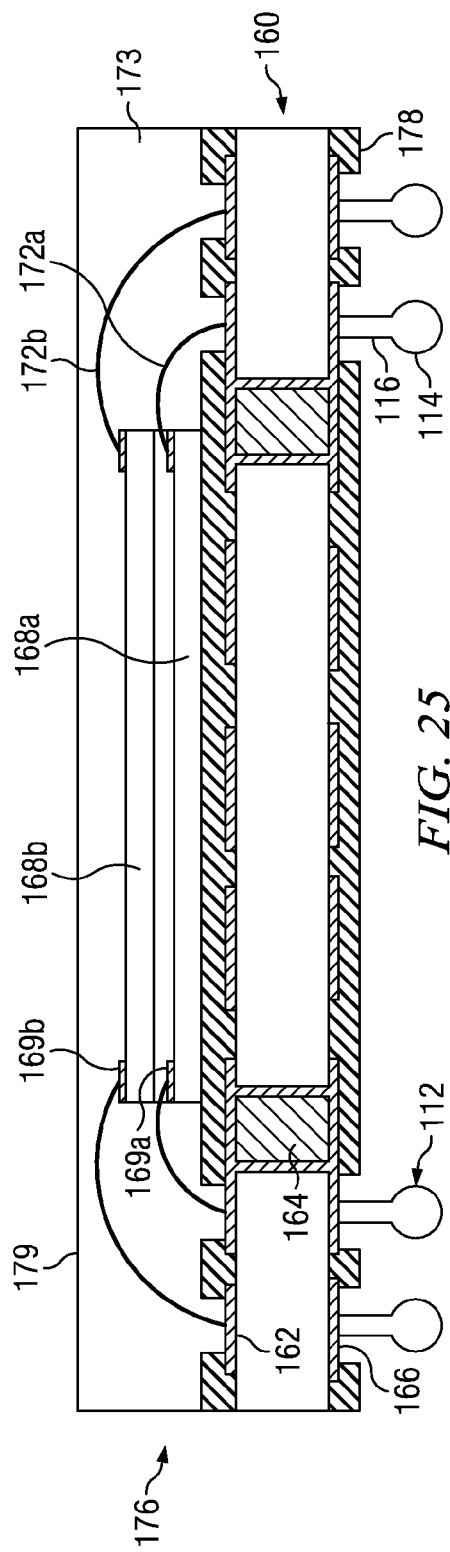
FIG. 25 is a cross-sectional view of a second substrate including metal stud bumps formed on a bottom surface thereof in accordance with an embodiment, wherein the metal stud bumps include a stick region and a ball region.
Figure 26:
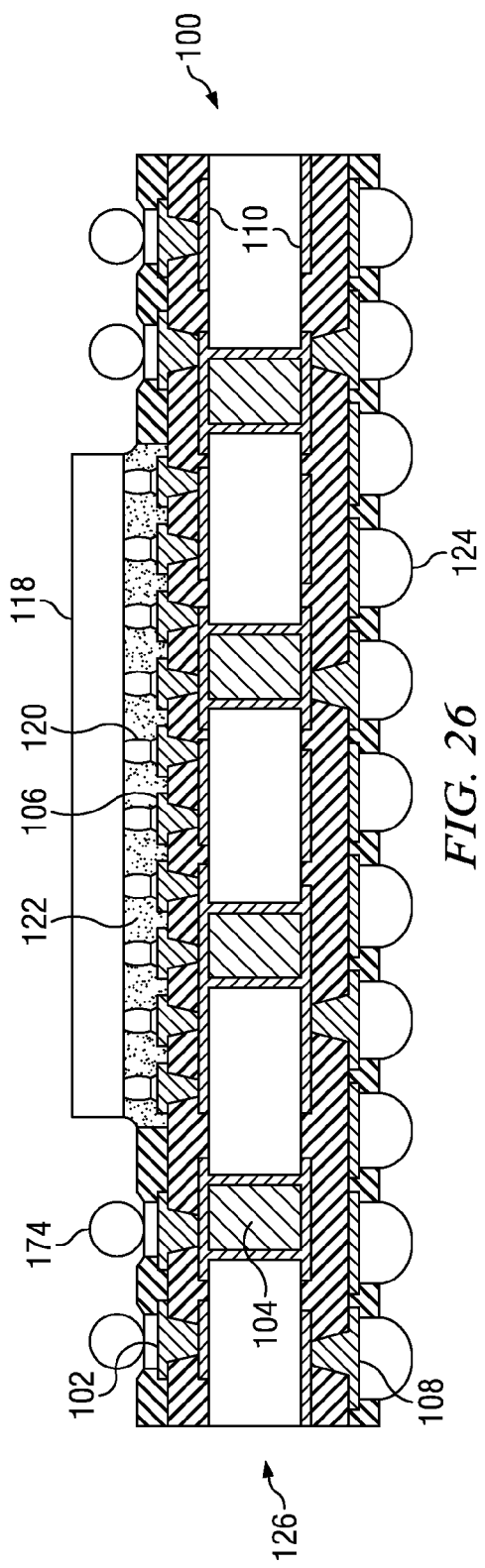
FIG. 26 is a cross-sectional view of a first substrate including solder balls formed on a top surface thereof in accordance with an embodiment.
Figure 27:
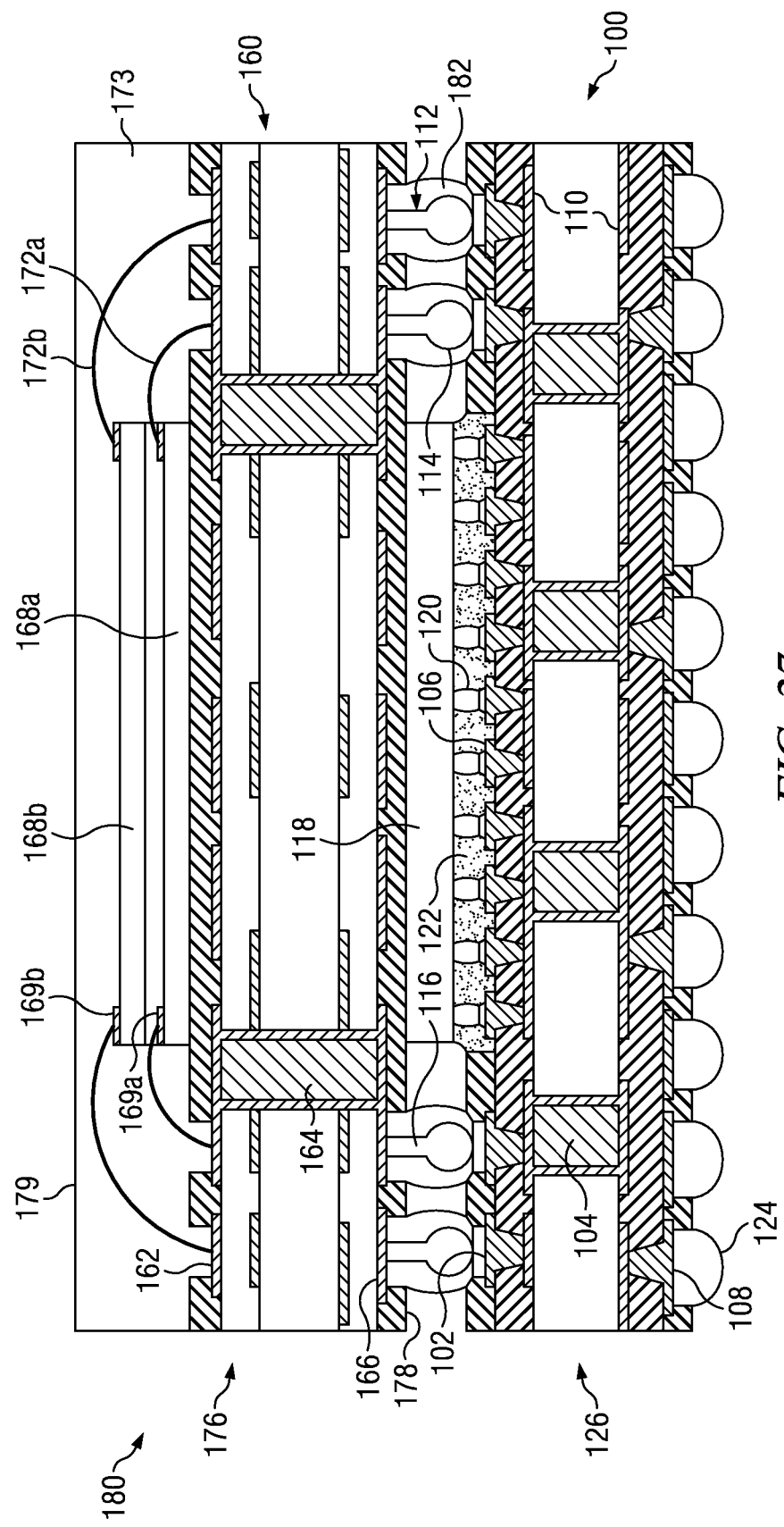
FIG. 27 is a cross-sectional view of a PoP device packaged in accordance with the embodiments shown in FIGS. 25 and 26.

For example, FIG. 25 is a cross-sectional view of a second substrate 160 including metal stud bumps 112 formed on a bottom surface thereof in accordance with an embodiment, wherein the metal stud bumps 112 each include a stick region 116 and a ball region 114. FIG. 26 is a cross-sectional view of a first substrate 100 including solder balls 174 formed on a top surface thereof. FIG. 27 is a cross-sectional view of a PoP device 180 packaged in accordance with the embodiments shown in FIGS. 25 and 26, wherein the top packaged die 176 that includes the metal stud bumps 112 is attached to the bottom packaged die 126 that includes the solder balls 174. Each solder joint 182 of the PoP device 180 includes a metal stud bump 112 at least partially embedded therein.

Figure 28:
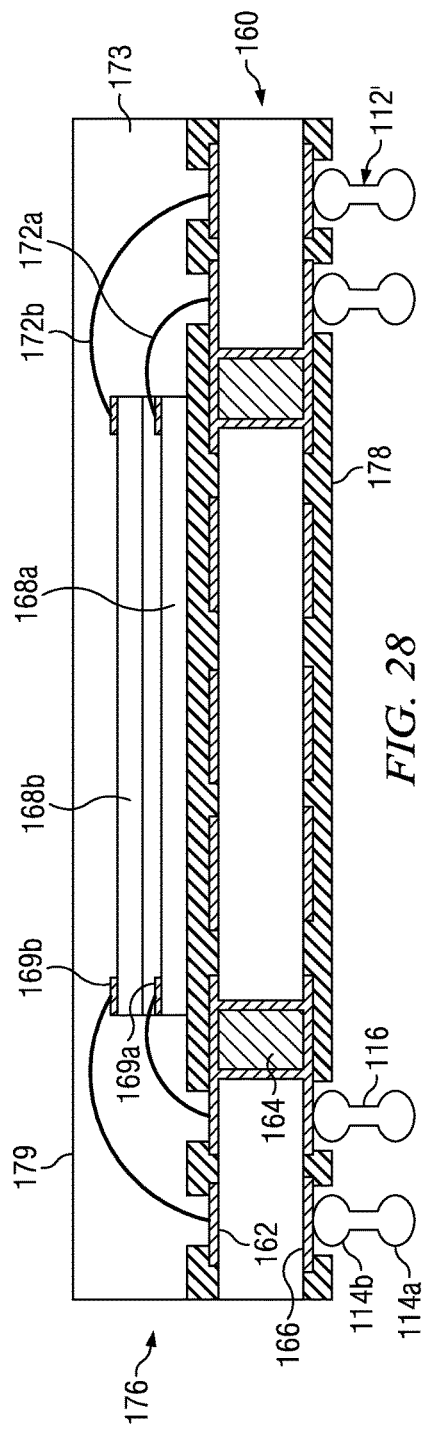
FIG. 28 is a cross-sectional view of a second substrate including metal stud bumps formed on a bottom surface thereof in accordance with an embodiment, wherein the metal stud bumps include two ball regions disposed at each end of a stick region, which is packaged with a first substrate shown in FIG. 26 to achieve a PoP device shown in FIG. 24.

As another example, FIG. 28 is a cross-sectional view of a second substrate 160 including metal stud bumps 112' formed on a bottom surface thereof in accordance with another embodiment, wherein the metal stud bumps 112' include two ball regions 114a and 114b disposed at each end of the stick region 116. The packaged second device 176 is packaged with a first substrate 100 shown in FIG. 26 to achieve a PoP device 180 shown in FIG. 24.

Figure 29:
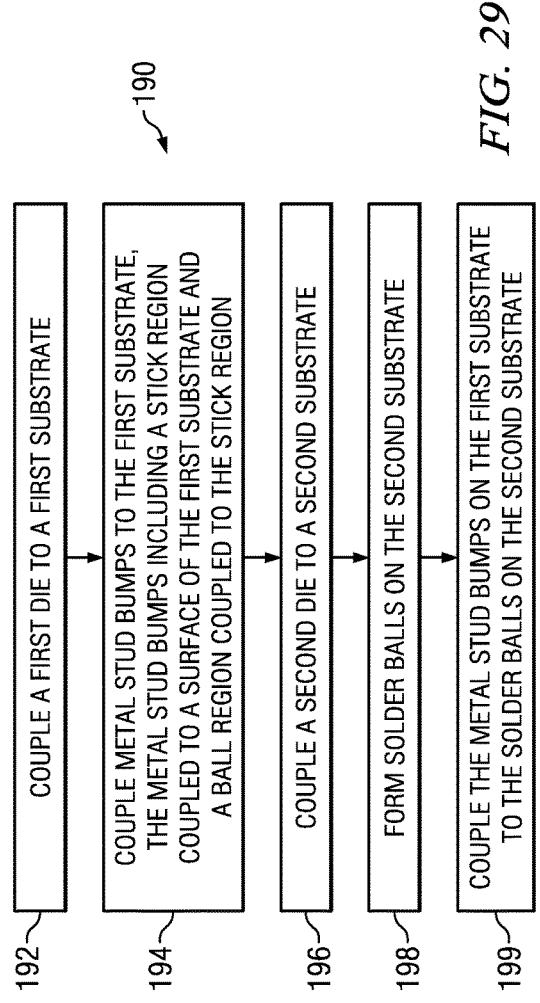
FIG. 29 is a flow chart illustrating a method of packaging semiconductor dies in accordance with an embodiment of the present disclosure.

FIG. 29 is a flow chart 190 illustrating a method of packaging semiconductor devices (i.e., a first die 118, a second die 168a, and/or a third die 168b) in accordance with an embodiment of the present disclosure. In step 192, a first die 118 is coupled to a first substrate 100. In step 194, a plurality of metal stud bumps 112 is coupled to the first substrate 100. The metal stud bumps 112 each includes a stick region 116 that is coupled to a surface of the first substrate 100 and a ball region 114 that is coupled to the stick region 116. In step 196, a second die 168a is coupled to a second substrate 160. In step 198, a plurality of solder balls 174 is formed on the second substrate 160. In step 199, each of the plurality of metal stud bumps 112 on the first substrate 100 is coupled to one of the plurality of solder balls 174 on the second substrate 160.

After the PoP devices 180 shown in FIGS. 22, 24, and 27 are packaged, the PoP devices 180 may be attached to a printed circuit board (PCB), to another type of end application board, or to a subsequent level packaging device using the solder balls 124 or contact pads 108 on the bottom surface of the PoP devices 180.

In some embodiments, the second dies 168a and 168b comprise memory devices such as random access memories (RAM) or other types of memory devices, and the first die 118 comprises a logic device. Alternatively, the second dies 168a and 168b and the first die 118 may comprise other functional circuitry. A different method may be used to attach the second dies 168a and 168b to the second substrate 160 than is used to attach the first die 118 to the first substrate 100, as shown in the drawings. Alternatively, the same method may be used to attach the first die 118 to the first substrate 100 that is used to attach the second dies 168a and 168b to the second substrate 160.

In some embodiments, the second dies 168a and 168b are packaged using a flip-chip WLP technique and wire bonding, and the first die 118 is packaged using a flip-chip and BOT technique, as an example. Alternatively, the second dies 168a and 168b and the first die 118 may be packaged using other methods or techniques.

Embodiments of the present disclosure include methods of packaging multiple semiconductor devices (e.g., first dies 118, second dies 168a, and also third dies 168b in some embodiments) in a single PoP device 180 using metal stud bumps 112 or 112' in the electrical connections (e.g., in the solder joints 182) between the first packaged dies 126 and the second packaged dies 176. Embodiments of the present disclosure also include PoP devices 180 that include the novel metal stud bumps 112 and 112' described herein.

Advantages of embodiments of the disclosure include providing novel metal stud bumps 112 and 112' that reduce the distance between first and second packaged dies 126 and 176 in PoP devices 180, and thus also reduce the overall thickness of the PoP devices 180 that include the metal stud bumps 112 and 112'. PoP devices 180 having an overall package thickness of about 1 mm or less are advantageously achievable by embodiments of the present disclosure, for example.

The methods and structures provide low cost, high accuracy metal stud bumps 112 and 112' for ultra thin PoP device 180 applications. The metal stud bumps 112 and 112' are formed using wire bonding devices, resulting in increased throughput, lowered costs, and increased yields. Highly uniform tail heights are achievable using the novel methods used to form the stick regions 116 of the metal stud bumps 112 and 112'.

The metal stud bump 112 and 112' overall height and width (diameter) is very small, thus reducing the amount of solder that is required to be used for the solder balls 174. The small overall height of the metal stud bumps 112 and 112' forms a low profile of solder around the metal stud bumps 112 and 112' after the solder reflow process of the solder balls 174, reducing the standoff height between the first and second packaged dies 126 and 176, thus also reducing the PoP device 180 thickness. Solder joints 182 having a height of about 150 μm or less are achievable by embodiments of the present disclosure, as an example. The innovative structures described herein advantageously produce ultra-thin stacked packages and packaging techniques for semiconductor devices.

Furthermore, because the diameter, e.g., the ball region 114, 114a, and 114b width comprising dimension $d_5$ of the metal stud bumps 112 and 112' is very small, the pitch of the contacts 166 on the bottom surface of the top packaged die 176 and the pitch of the bond pads 102 on the top surface of the bottom packaged die 126 may be reduced, resulting in a smaller width in a top view for the packaged dies 126 and 176 and also the PoP device 180. A bond pitch of about 50 to 350 μm is advantageously achievable by embodiments of the present disclosure.

The metal stud bumps 112 and 112' described herein may be produced with low costs, providing a cost savings in the packaging process. The presence of the metal stud bumps 112 and 112' in the solder joints 182 facilitates in the prevention of bridging of adjacent solder joints 182 in some embodiments, reducing or preventing shorts and improving device yields. The novel PoP structures and designs described herein are easily implementable in semiconductor device packaging process flows. Embodiments of the present disclosure are particularly advantageous for use in end applications that require low profile packages, such as handheld products, for example. The techniques described herein to form the metal stud bumps 112 and 112' are implementable on low cost flip chip chip scale packages (FCCP) substrates 100 and 160 that include OSP pads, which also improves assembly yields in some applications.

Because the novel metal stud bumps 112 and 112' have a ball region 114 or 114a on a top surface, the overall height of the metal stud bumps 112 and 112' can be more easily and well controlled. The metal stud bumps 112 and 112' are flexible, yet have a predetermined degree of stiffness that prevents them from being deformed easily.

In accordance with one embodiment of the present disclosure, a PoP device includes a first packaged die and a second packaged die coupled to the first packaged die. A plurality of metal stud bumps is disposed between the first packaged die and the second packaged die. Each of the plurality of metal stud bumps includes a stick region, a first ball region coupled to a first end of the stick region, and a second ball region coupled to a second end of the stick region. Each of the plurality of metal stud bumps comprises a portion that is at least partially embedded in a solder joint.

In accordance with another embodiment, a method of packaging semiconductor dies includes coupling a first die to a first substrate and coupling a plurality of metal stud bumps to the first substrate. Each of the plurality of metal stud bumps includes a stick region coupled to a surface of the first substrate and a ball region coupled to the stick region. The method includes coupling a second die to a second substrate and forming a plurality of solder balls on the second substrate. Each of the plurality of metal stud bumps on the first substrate is coupled to one of the plurality of solder balls on the second substrate.

In accordance with yet another embodiment, a method of packaging semiconductor dies includes coupling a first die to a first substrate and coupling a plurality of metal stud bumps to the first substrate. Each of the plurality of metal stud bumps includes a first ball region coupled to a surface of the first substrate, a stick region coupled to the first ball region at a first end of the stick region, and a second ball region coupled to a second end of the stick region. The method includes coupling a second die to a second substrate and forming a plurality of solder balls on the second substrate. Each of the plurality of metal stud bumps on the first substrate is coupled to one of the plurality of solder balls on the second substrate.

In accordance with yet another embodiment, a semiconductor device is provided. The semiconductor device includes a first substrate, a second substrate coupled to the first substrate, and a plurality of metal stud bumps disposed between the first substrate and the second substrate, wherein each of the plurality of metal stud bumps includes a stick region, a first ball region coupled to a first end of the stick region, and a second ball region coupled to a second end of the stick region, the first ball region, the second ball region, and the stick region being a single continuous material, wherein the first ball region and the second ball region have a larger width than the stick region. Solder joints extend from the second substrate to the first substrate, each of the solder joints extending along a corresponding one of the plurality of metal stud bumps.

In accordance with yet another embodiment, a semiconductor device is provided. The semiconductor device includes a first packaged die, a second packaged die coupled to the first packaged die, and a plurality of metal stud bumps disposed between the first packaged die and the second packaged die, wherein each of the plurality of metal stud bumps includes a stick region interposed between a first ball region and a second ball region, the first ball region, the second ball region, and the stick region being a single continuous material, wherein the first ball region and the second ball region have a larger width than the stick region. Solder joints surround sidewalls of the plurality of metal stud bumps and extend between the first packaged die and the second packaged die.

In accordance with yet another embodiment, a window clamp is provided. The window clamp includes a substrate, a first recess in the substrate, a second recess in the substrate, and an opening in the substrate. The second recess is interposed between the first recess and the opening, and the first recess and the second recess are configured to flip a metal stud bump for a semiconductor connector. The opening is configured to attach the metal stud bump to a contact pad of a semiconductor device through the opening.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
 a first substrate having a first packaged die on the first substrate;
 a second substrate coupled to the first substrate, the first packaged die interposing the first substrate and the second substrate;
 a plurality of metal stud bumps disposed between the first substrate and the second substrate, wherein each of the plurality of metal stud bumps includes a stick region, a first ball region coupled to a first end of the stick region, and a second ball region coupled to a second end of the stick region, the first ball region, the second ball region, and the stick region being a single continuous material, wherein the first ball region and the second ball region have a larger width than the stick region; and solder joints extending from the second substrate to the first substrate, each of the solder joints extending along a corresponding one of the plurality of metal stud bumps, each of the solder joints having a first portion surrounding a stick region of the corresponding one of the plurality of metal stud bumps, a second portion surrounding a first ball region of the corresponding one of the plurality of metal stud bumps, and a third portion surrounding a second ball region of the corresponding one of the plurality of metal stud bumps, a width of the first portion being greater than a width of the second portion and a width of the third portion, wherein a solder material of the solder joints does not completely separate the plurality of metal stud bumps from the second substrate.

2. The semiconductor device according to claim 1, wherein the first ball region and the second ball region of the plurality of metal stud bumps comprise a width of about 1.2 to 3.0 times a width of the stick region of the plurality of metal stud bumps.

3. The semiconductor device according to claim 2, wherein the first ball region and the second ball region of the plurality of metal stud bumps have a height of about 50 to 150 μm.

4. The semiconductor device according to claim 1, wherein the stick region of the plurality of metal stud bumps comprises a width of about 1 to 10 mils.

5. The semiconductor device according to claim 4, wherein the first ball region and the second ball region of the plurality of metal stud bumps have a height of about 100 to 500 μm.

6. The semiconductor device according to claim 1, wherein the plurality of metal stud bumps comprises a material selected from the group consisting essentially of Cu, Al, Au, Pt, Pd, and combinations thereof.

7. The semiconductor device according to claim 1, wherein the second substrate comprises a second packaged die.

8. The semiconductor device according to claim 7, wherein the second packaged die comprises a plurality of second dies stacked vertically above the second substrate.

9. The semiconductor device according to claim 7, wherein the first substrate or the second substrate comprises a plurality of through substrate vias disposed therein.

10. A semiconductor device, comprising:
a first packaged die on a first packaging substrate;
a plurality of solder bumps interposed between the first packaged die and the first packaging substrate;
a second packaged die in a second packaging substrate, the second packaged die coupled to the first packaged die, the first packaged die vertically interposing the first packaging substrate and the second packaging substrate; and
a plurality of metal stud bumps disposed between the first packaging substrate and the second packaging substrate, wherein each of the plurality of metal stud bumps includes a stick region interposed between a first ball region and a second ball region, the first ball region, the second ball region, and the stick region being a single continuous material, wherein the first ball region and the second ball region have a larger width than the stick region; and
solder joints surrounding sidewalls of the plurality of metal stud bumps, the solder joints extending between the first packaged die and the second packaged die, each of the solder joints extending along a corresponding one of the plurality of metal stud bumps, each of the solder joints having a first portion surrounding a stick region of the corresponding one of the plurality of metal stud bumps, a second portion surrounding a first ball region of the corresponding one of the plurality of metal stud bumps, and a third portion surrounding a second ball region of the corresponding one of the plurality of metal stud bumps, a width of the first portion being greater than a width of the second portion and a width of the third portion, wherein the plurality of metal stud bumps are in direct physical contact with the first packaging substrate and the second packaging substrate, and wherein bottommost surfaces of the solder joints are above bottommost surfaces of the plurality of solder bumps.

11. The semiconductor device of claim 10, wherein the plurality of metal stud bumps comprises Cu, Al, Au, Pt, Pd, or combinations thereof.

12. The semiconductor device of claim 10, wherein the first packaged die comprises an integrated circuit die, the integrated circuit die being laterally interposed between select ones of the plurality of metal stud bumps.

13. The semiconductor device of claim 10, wherein the first packaged die comprises a first integrated circuit die, wherein the second packaged die comprises a second integrated circuit die, wherein the first integrated circuit die is vertically interposed between the first packaging substrate and the second packaging substrate, and wherein the plurality of metal stud bumps are coupled to the first packaging substrate and the second packaging substrate.

14. The semiconductor device of claim 13, further comprising an underfill interposed between the first packaging substrate and the first integrated circuit die, the underfill not extending to the plurality of metal stud bumps.

15. The semiconductor device of claim 13, wherein each of the first packaging substrate and the second packaging substrate have a plurality of through vias.

16. The semiconductor device according to claim 10, wherein the first ball region and the second ball region of the plurality of metal stud bumps comprise a width of about 1.2 to 3.0 times a width of the stick region of the plurality of metal stud bumps.

17. A semiconductor device, comprising:
a first packaged die on a first surface of a first substrate;
a second packaged die on a second surface of a second substrate and coupled to the first packaged die, the first packaged die being interposed between the first substrate and the second substrate, the second substrate having a third surface opposite the second surface, the third surface of the second substrate facing the first surface of the first substrate, a surface of the first packaged die being closer to the third surface of the second substrate than the first surface of the first substrate; and
a plurality of metal stud bumps disposed between the first substrate and the second substrate, wherein each of the plurality of metal stud bumps includes a straight stick region extending from a first ball region to a terminating end, the first ball region, the straight stick region, and the terminating end being a single continuous material, wherein the first ball region has a larger width than the straight stick region; and
solder joints surrounding the first ball regions of the plurality of metal stud bumps, each of the solder joints extending along a corresponding one of the plurality of metal stud bumps, each of the solder joints having a first portion surrounding a straight stick region of the corresponding one of the plurality of metal stud bumps and a second portion surrounding a first ball region of the corresponding one of the plurality of metal stud bumps, a width of the first portion being greater than a width of the second portion, wherein a solder material of the solder joints does not completely separate the first ball regions of the plurality of metal stud bumps and the first substrate or the second substrate, wherein the solder material of the solder joints does not completely separate the terminating ends of the plurality of metal stud bumps and the first substrate or the second substrate, and wherein the solder material of the solder joints extends into the first substrate and the second substrate.

18. The semiconductor device of claim 17, wherein the solder joints extend from the first substrate to the second substrate.

19. The semiconductor device of claim 17, wherein each of the terminating ends of the plurality of metal stud bumps comprises a second ball region.

20. The semiconductor device of claim 17, wherein each of the first ball regions of the plurality of metal stud bumps has a width of about 1.2 to about 3.0 times a width of each of the straight stick regions of the plurality of metal stud bumps.

* * * * *